(12) United States Patent
Ohkubo et al.

(10) Patent No.: US 10,462,404 B2
(45) Date of Patent: Oct. 29, 2019

(54) SOLID-STATE IMAGE SENSOR, METHOD FOR PRODUCING SOLID-STATE IMAGE SENSOR, AND ELECTRONIC APPARATUS

(71) Applicant: Sony Corporation, Tokyo (JP)

(72) Inventors: Tomohiro Ohkubo, Kumamoto (JP); Suzunori Endo, Kumamoto (JP)

(73) Assignee: Sony Corporation, Tokyo (JP)

( * ) Notice: Subject to any disclaimer, the term of this patent is extended or adjusted under 35 U.S.C. 154(b) by 201 days.

(21) Appl. No.: 15/589,999

(22) Filed: May 8, 2017

(65) Prior Publication Data
US 2017/0244920 A1 Aug. 24, 2017

Related U.S. Application Data

(63) Continuation of application No. 14/593,616, filed on Jan. 9, 2015, now Pat. No. 9,659,984, which is a continuation of application No. 13/606,828, filed on Sep. 7, 2012, now Pat. No. 8,964,081.

(30) Foreign Application Priority Data

Sep. 16, 2011 (JP) ................. 2011-203337

(51) Int. Cl.
*H04N 5/374* (2011.01)
*H01L 27/146* (2006.01)
*H01L 27/148* (2006.01)
*H01L 27/30* (2006.01)

(52) U.S. Cl.
CPC ......... *H04N 5/374* (2013.01); *H01L 27/1463* (2013.01); *H01L 27/1464* (2013.01); *H01L 27/14623* (2013.01); *H01L 27/14629* (2013.01); *H01L 27/14636* (2013.01); *H01L 27/14643* (2013.01); *H01L 27/14667* (2013.01); *H01L 27/14689* (2013.01); *H01L 27/14893* (2013.01); *H01L 27/307* (2013.01)

(58) Field of Classification Search
CPC .............. H04N 5/374; H01L 27/14623; H01L 27/14629; H01L 27/1464; H01L 27/1463; H01L 27/14689; H01L 27/14636; H01L 27/14643; H01L 27/14667; H01L 27/307; H01L 27/14893
See application file for complete search history.

(56) References Cited

U.S. PATENT DOCUMENTS

| | | | | |
|---|---|---|---|---|
| 2011/0109776 A1* | 5/2011 | Kawai | ............... | H01L 27/14625 348/273 |
| 2011/0279727 A1* | 11/2011 | Kusaka | ............. | H01L 27/14621 348/340 |
| 2012/0025199 A1* | 2/2012 | Chen | ................... | H01L 27/1464 257/75 |
| 2014/0347538 A1* | 11/2014 | Toda | ................. | H01L 27/14603 348/308 |

* cited by examiner

*Primary Examiner* — Gevell V Selby
(74) *Attorney, Agent, or Firm* — Sheridan Ross P.C.

(57) ABSTRACT

A solid-state image sensor includes a semiconductor substrate having a photoelectric conversion element converting incident light into a charge and a charge retaining section temporarily retaining the charge photoelectrically converted by the photoelectric conversion element and a light shielding section having an embedded section extending in at least a region between the photoelectric conversion element and the charge retaining section of the semiconductor substrate.

17 Claims, 23 Drawing Sheets

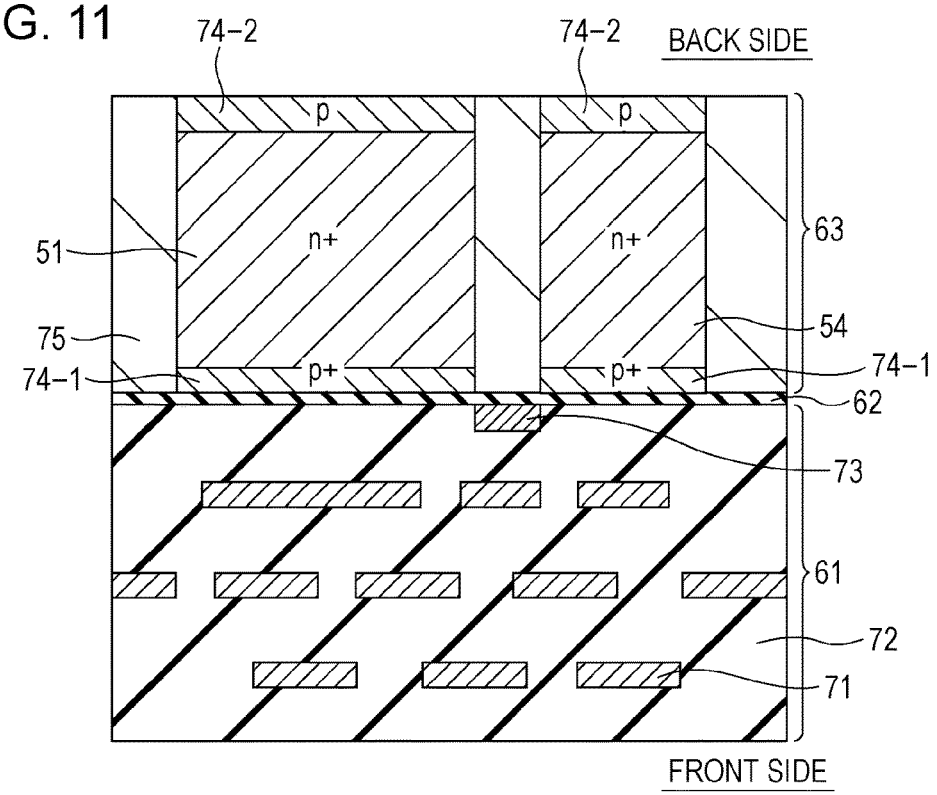
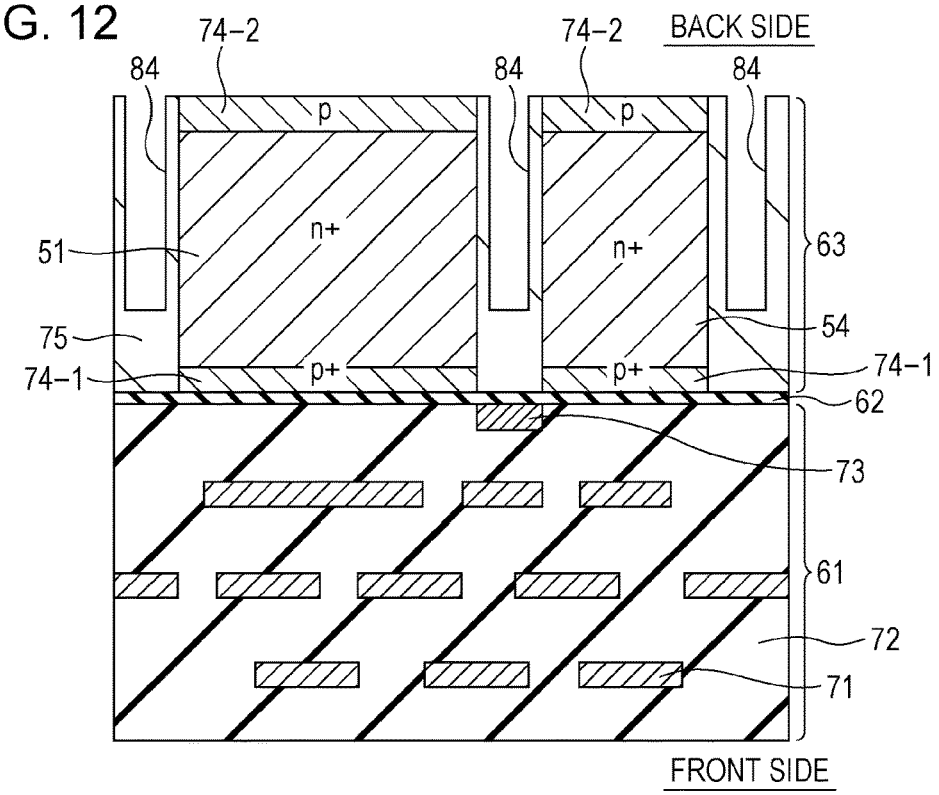

SOLID-STATE IMAGE SENSOR, METHOD FOR PRODUCING SOLID-STATE IMAGE SENSOR, AND ELECTRONIC APPARATUS

CROSS-REFERENCE TO RELATED APPLICATIONS

This application is a continuation of U.S. patent application Ser. No. 14/593,616, filed Jan. 9, 2015, now U.S. Pat. No. 9,659,984, which is a continuation of U.S. patent application Ser. No. 13/606,828, filed Sep. 7, 2012, now U.S. Pat. No. 8,964,081, which claims priority to Japanese Patent Application JP 2011-203337, filed in the Japan Patent Office on Sep. 16, 2011, the entire disclosures of which are hereby incorporated herein by reference.

BACKGROUND

The present technology relates to solid-state image sensors, methods for producing the solid-state image sensor, and electronic apparatus and, in particular, to a solid-state image sensor, a method for producing the solid-state image sensor, and an electronic apparatus which make it possible to obtain a better pixel signal.

In the past, a solid-state image sensor such as a CMOS (complementary metal oxide semiconductor) image sensor and a CCD (charge coupled device) has been widely used in a digital still camera, a digital video camera, and the like.

For example, the light that has entered a CMOS image sensor is photoelectrically converted in a PD (photodiode) of a pixel. Then, the charge generated in the PD is transferred to FD (floating diffusion) via a transfer transistor and is converted into a pixel signal at a level in accordance with the amount of received light.

Incidentally, in an existing CMOS image sensor, since a method by which pixel signals are sequentially read from the pixels on a row-by-row basis (a so-called rolling shutter method) is generally adopted, distortion sometimes occurs in an image due to a difference in exposure timing.

It is for this reason that Japanese Unexamined Patent Application Publication No. 2008-103647, for example, discloses a CMOS image sensor that adopts a method by which the pixel signals are read simultaneously from all the pixels by providing a charge retaining section in the pixel (a so-called global shutter method) and has an all-pixel simultaneous electronic shutter function. By adopting the global shutter method, all the pixels have the same exposure timing, making it possible to prevent distortion from occurring in the image.

Now, when a configuration in which the charge retaining section is provided in the pixel is adopted, the layout of pixels is limited. This may decrease the aperture ratio, resulting in a reduction in the sensitivity of a PD and the capacity of the PD and the charge retaining section. Furthermore, optical noise may be generated as a result of the light entering the charge retaining section retaining the charge.

With reference to FIG. 1, the light that enters the charge retaining section will be described. In FIG. 1, a sectional configuration example of one pixel of the CMOS image sensor is shown.

As shown in FIG. 1, a pixel 11 is formed of a semiconductor substrate 12, an oxide film 13, a wiring layer 14, a color filter layer 15, and an on-chip lens 16 which are stacked. Furthermore, in the semiconductor substrate 12, a PD 17 and a charge retaining section 18 are formed. In the pixel 11, a region in which the PD 17 is formed is a PD region 19, and a region in which the charge retaining section 18 is formed is a charge retaining region 20. Moreover, in the wiring layer 14, a light shielding film 21 having an opening in a region corresponding to the PD 17 is provided.

In the pixel 11 configured as described above, the light that has been concentrated by the on-chip lens 16 and has passed through the color filter layer 15 and the wiring layer 14 passes through the opening of the oxide film 13 and illuminates the PD 17. However, as indicated with solid-white arrows in FIG. 1, when the light is incident obliquely, the light sometimes passes through the PD 17 and enters the charge retaining region 20. If a charge generated as a result of the light that has entered the charge retaining region 20 being photoelectrically converted in the depth of the semiconductor substrate 12 leaks into the charge retaining section 18 retaining the charge, optical noise is generated.

Moreover, in recent years, as disclosed in Japanese Unexamined Patent Application Publication No. 2003-31785, for example, a back-illuminated-type CMOS image sensor has been developed. In the back-illuminated-type CMOS image sensor, since a wiring layer in a pixel can be formed on the back (a side opposite to the side on which the light is incident) of the sensor, it is possible to prevent the vignetting of the incident light caused by the wiring layer.

In FIG. 2, a sectional configuration example of one pixel of the back-illuminated-type CMOS image sensor is shown. Moreover, in FIG. 2, such components as are found also in the pixel 11 of FIG. 1 are identified with the same reference characters, and their detailed descriptions will be omitted.

As shown in FIG. 2, in a pixel 11', the light illuminates the back side (a face facing an upper portion of FIG. 2) of the semiconductor substrate 12, the back side which is a side opposite to the front side of the semiconductor substrate 12 on which the wiring layer 14 is provided. Moreover, in the pixel 11', the charge retaining section 18 is formed on the front side of the semiconductor substrate 12, and a light shielding layer 22 having a light shielding film 21 is formed between the semiconductor substrate 12 and the color filter layer 15.

In the pixel 11' of the back-illuminated-type CMOS image sensor configured as described above, it is possible to increase the sensitivity of the PD 17. However, since the charge retaining section 18 is formed on the front side of the semiconductor substrate 12, that is, the charge retaining section 18 is formed in a deep region of the semiconductor substrate 12 for the incident light, it is difficult to prevent the leakage of light into the charge retaining section 18.

That is, as indicated with solid-white arrows in FIG. 2, the light that has passed through the on-chip lens 16 at an angle sometimes leaks into the charge retaining section 18 after passing through the opening of the light shielding film 21, the opening formed above the PD region 19. If the light leaks into the charge retaining section 18 retaining the charge, optical noise is generated.

SUMMARY

As described above, in a configuration in which a charge retaining section is provided in a pixel, since a PD is made smaller in size, the sensitivity of the PD is reduced, and optical noise is sometimes generated as a result of the light leaking into the charge retaining section retaining the charge. This makes it difficult to obtain a good pixel signal.

It is desirable to make it possible to obtain a better pixel signal.

A solid-state image sensor according to an embodiment of the present technology includes: a semiconductor substrate having a photoelectric conversion element converting incident light into a charge and a charge retaining section temporarily retaining the charge photoelectrically converted by the photoelectric conversion element; and a light shielding section having an embedded section extending in at least a region between the photoelectric conversion element and the charge retaining section of the semiconductor substrate.

A production method according to another embodiment of the present technology includes: forming, on a semiconductor substrate, a photoelectric conversion element converting incident light into a charge and a charge retaining section temporarily retaining the charge photoelectrically converted by the photoelectric conversion element; and forming a light shielding section having an embedded section extending in at least a region between the photoelectric conversion element and the charge retaining section of the semiconductor substrate.

An electronic apparatus according to still another embodiment of the present technology includes a solid-state image sensor including a semiconductor substrate having a photoelectric conversion element converting incident light into a charge and a charge retaining section temporarily retaining the charge photoelectrically converted by the photoelectric conversion element and a light shielding section having an embedded section extending in at least a region between the photoelectric conversion element and the charge retaining section of the semiconductor substrate.

According to the embodiment of the present technology, the photoelectric conversion element and the charge retaining section are formed on the semiconductor substrate, and the light is blocked by the light shielding section having the embedded section extending in at least a region between the photoelectric conversion element and the charge retaining section.

According to the embodiment of the present technology, it is possible to obtain a better pixel signal.

BRIEF DESCRIPTION OF THE DRAWINGS

FIG. 11 is a diagram illustrating a fourth process;
FIG. 12 is a diagram illustrating a fifth process.

DETAILED DESCRIPTION OF EMBODIMENTS

Hereinafter, a specific embodiment according to the present technology will be described in detail with reference to the drawings.

Figure 3:
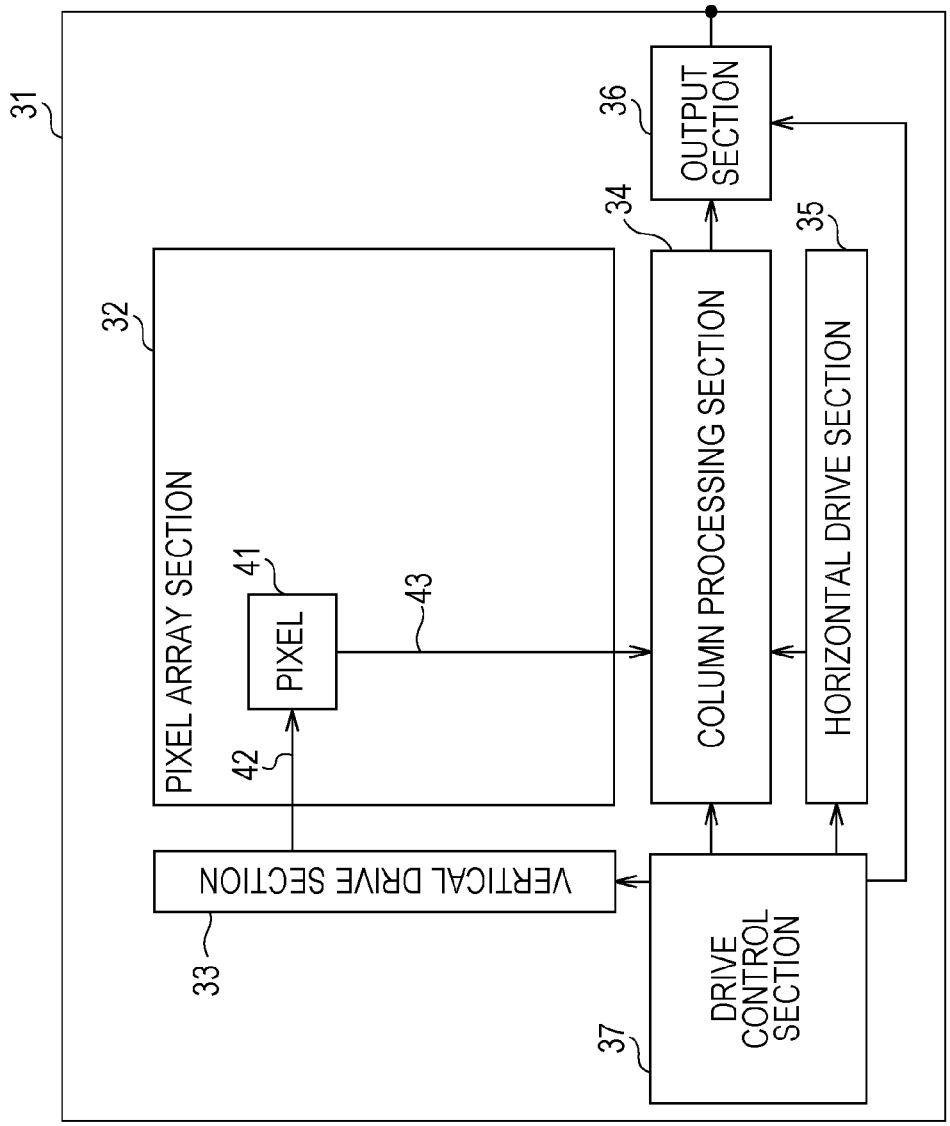
FIG. 3 is a block diagram showing a configuration example of a solid-state image sensor to which an embodiment of the present technology is applied.

FIG. 3 is a block diagram showing a configuration example of a solid-state image sensor to which an embodiment of the present technology is applied.

In FIG. 3, a solid-state image sensor 31 is a CMOS solid-state image sensor and includes a pixel array section 32, a vertical drive section 33, a column processing section 34, a horizontal drive section 35, an output section 36, and a drive control section 37.

The pixel array section 32 has a plurality of pixels 41 arranged in an array, and the pixels 41 are connected to the vertical drive section 33 via a plurality of horizontal signal lines 42 based on the number of rows of the pixels 41 and are connected to the column processing section 34 via a plurality of vertical signal lines 43 based on the number of columns of the pixels 41. That is, the pixels 41 of the pixel array section 32 are disposed at the points of intersection of the horizontal signal lines 42 and the vertical signal lines 43.

The vertical drive section 33 sequentially supplies drive signals (a transfer signal, a selection signal, a reset signal, and the like) for driving the pixels 41 to each of the rows of the pixels 41 of the pixel array section 32 via the horizontal signal line 42.

The column processing section 34 extracts the signal level of a pixel signal output from each pixel 41 via the vertical signal line 43 by performing CDS (correlated double sampling) on the pixel signal and acquires pixel data in accordance with the amount of received light of the pixel 41.

The horizontal drive section 35 sequentially supplies, to the column processing section 34, drive signals for making the column processing section 34 output the pixel data acquired from each pixel 41 for each of the columns of the pixels 41 of the pixel array section 32.

To the output section 36, the pixel data is supplied from the column processing section 34 with timing in accordance with the drive signals of the horizontal drive section 35, and the output section 36 amplifies the pixel data, for example, and outputs the amplified pixel data to an image processing circuit in a next stage.

The drive control section 37 controls the driving of each block in the solid-state image sensor 31. For example, the drive control section 37 generates a clock signal in accordance with the drive cycle of each block and supplies the clock signal to the block.

Figure 4:
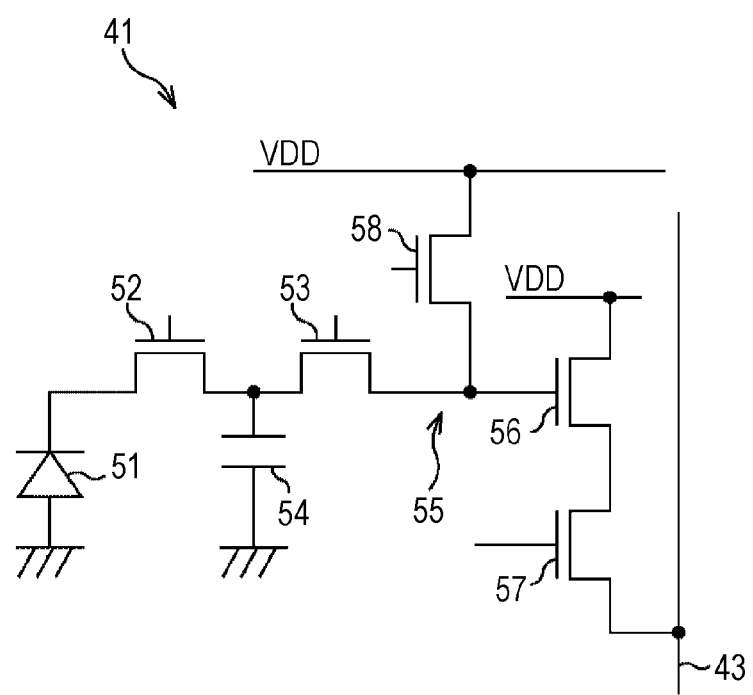
FIG. 4 is a circuit diagram showing a configuration example of a pixel.

FIG. 4 is a circuit diagram showing a configuration example of the pixel 41.

As shown in FIG. 4, the pixel 41 includes a PD 51, a first transfer transistor 52, a second transfer transistor 53, a charge retaining section 54, FD 55, an amplification transistor 56, a selection transistor 57, and a reset transistor 58.

The PD 51 receives the light illuminating the pixel 41 and generates and stores a charge in accordance with the amount of the received light.

The first transfer transistor 52 is driven in accordance with the transfer signal supplied from the vertical drive section 33. When the first transfer transistor 52 is turned on, the charge stored in the PD 51 is transferred to the charge retaining section 54.

The second transfer transistor 53 is driven in accordance with the transfer signal supplied from the vertical drive section 33. When the second transfer transistor 53 is turned on, the charge stored in the charge retaining section 54 is transferred to the FD 55.

The charge retaining section 54 stores the charge transferred from the PD 51 via the first transfer transistor 52.

The FD 55 is a floating diffusion region having a predetermined capacity, the floating diffusion region formed at a connection point between the second transfer transistor 53 and a gate electrode of the amplification transistor 56, and stores the charge transferred from the charge retaining section 54 via the second transfer transistor 53.

The amplification transistor 56 is connected to a power supply VDD (not shown) and outputs a pixel signal at a level based on the charge stored in the FD 55.

The selection transistor 57 is driven in accordance with the selection signal supplied from the vertical drive section 33. When the selection transistor 57 is turned on, the pixel signal which is output from the amplification transistor 56 can be read into the vertical signal line 43 via the selection transistor 57.

The reset transistor 58 is driven in accordance with the reset signal supplied from the vertical drive section 33. When the reset transistor 58 is turned on, the charge stored in the FD 55 is discharged to the power supply VDD via the reset transistor 58, and the FD 55 is reset.

In the solid-state image sensor 31 having the pixel 41 configured as described above, the global shutter method is adopted, and it is possible to make all the pixels 41 transfer a charge to the charge retaining section 54 from the PD 51 at the same time and allow all the pixels 41 to have the same exposure timing. This makes it possible to prevent distortion from occurring in the image.

Figure 5:
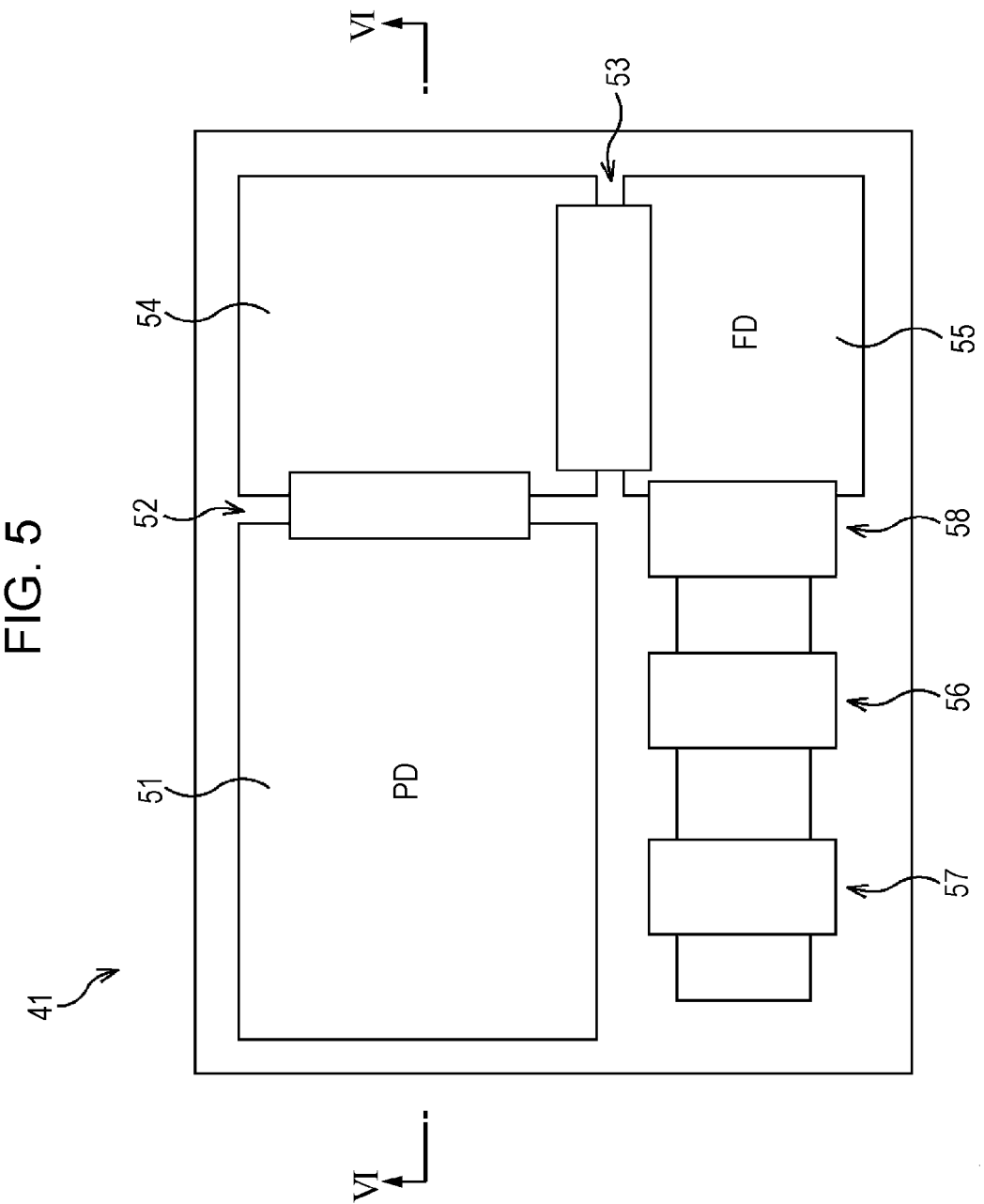
FIG. 5 is a diagram showing a planar configuration example of the pixel.

FIG. 5 is a diagram showing a planar configuration example of the pixel 41.

As shown in FIG. 5, in the pixel 41, the PD 51, the charge retaining section 54, and the FD 55 are disposed on a plane surface. As a result of the charge retaining section 54 being provided in the pixel 41 as just described, the area of the PD 51 becomes small, which may reduce the sensitivity of the PD 51. Therefore, to increase the sensitivity of the PD 51, the solid-state image sensor 31 adopts a back-illuminated-type structure.

Figure 6:
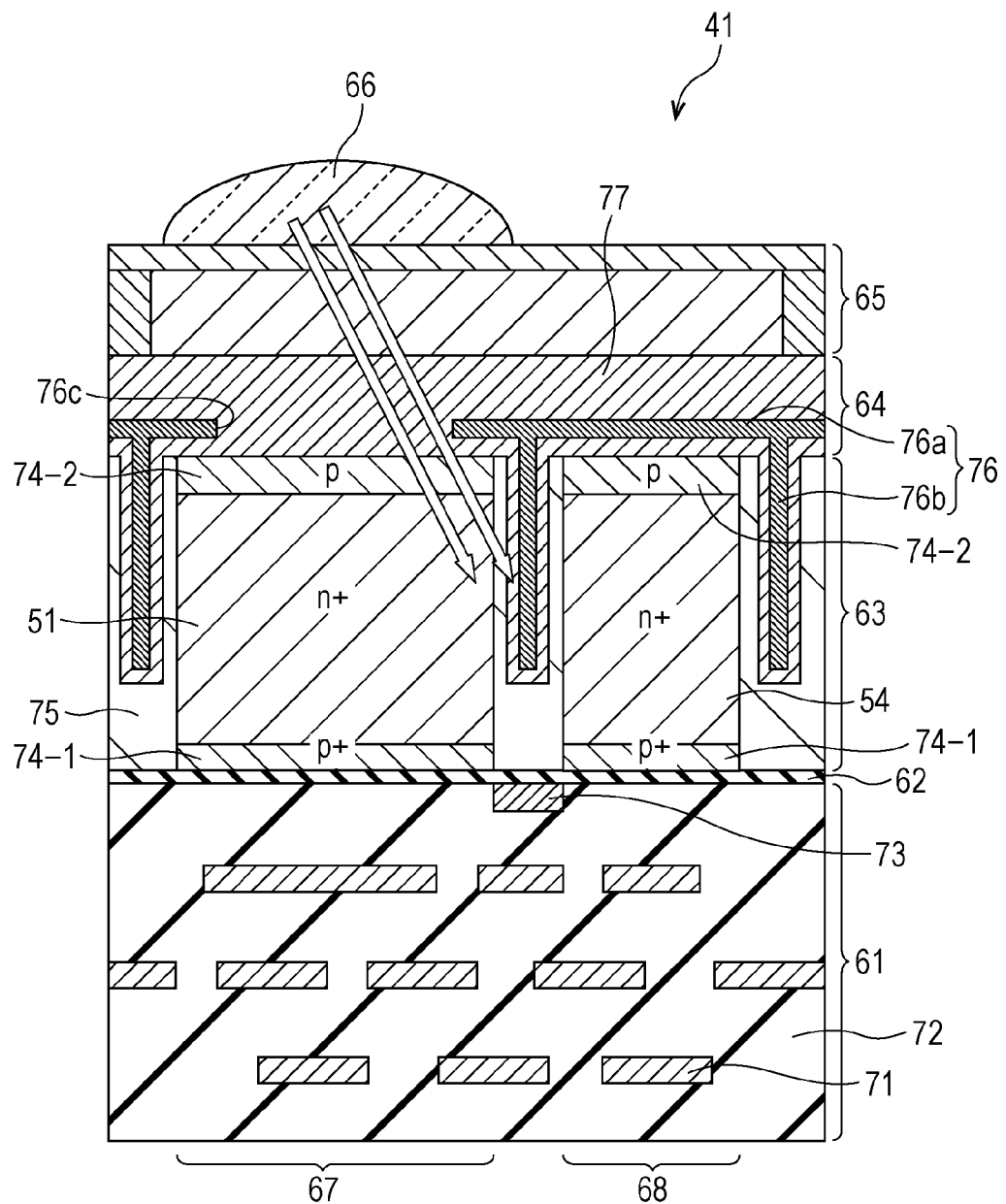
FIG. 6 is a sectional view showing a first configuration example of the pixel.

FIG. 6 is a diagram showing a sectional configuration example of the pixel 41 taken on the line VI-VI indicated with arrows of FIG. 5. In FIG. 6, a first configuration example of the pixel 41 is shown.

As shown in FIG. 6, the pixel 41 is formed of a wiring layer 61, an oxide film 62, a semiconductor substrate 63, a light shielding layer 64, a color filter layer 65, and an on-chip lens 66 which are stacked in this order from a lower portion of FIG. 6. Moreover, in the pixel 41, a region in which the PD 51 is formed in the semiconductor substrate 63 is a PD region 67, and a region in which the charge retaining section 54 is formed in the semiconductor substrate 63 is a charge retaining region 68. Incidentally, the solid-state image sensor 31 is a so-called back-illuminated-type CMOS image sensor in which the incident light illuminates the back side (a face facing an upper portion of FIG. 6) of the semiconductor substrate 63, the back side which is a side opposite to the front side of the semiconductor substrate 63 on which the wiring layer 61 is provided.

The wiring layer 61 is supported by, for example, a substrate support (not shown) disposed under the wiring layer 61 and is formed of a plurality of wirings 71 performing, for example, reading of the charge of the PD 51 formed in the semiconductor substrate 63 and an interlayer dielectric film 72, the wirings 71 which are embedded in the interlayer dielectric film 72. Moreover, in the wiring layer 61, in a region between the PD 51 and the charge retaining section 54, a gate electrode 73 forming the first transfer transistor 52 is disposed on the semiconductor substrate 63 with the oxide film 62 located between the gate electrode 73 and the semiconductor substrate 63. When a predetermined voltage is applied to the gate electrode 73, the charge stored in the PD 51 is transferred to the charge retaining section 54.

The oxide film 62 has insulation properties and insulates the front side of the semiconductor substrate 63.

In the semiconductor substrate 63, an N-type region forming the PD 51 and an N-type region forming the charge retaining section 54 are formed. Moreover, on the back side of the PD 51 and the charge retaining section 54, a front pinning layer 74-1 is formed, and, on the front side of the PD 51 and the charge retaining section 54, a front pinning layer 74-2 is formed. Furthermore, in the semiconductor substrate 63, an inter-pixel separation region 75 for separating a pixel 41 from another pixel 41 lying next to the pixel 41 is formed in such a way as to surround the pixel 41.

The light shielding layer 64 is formed of a light shielding section 76 made of a light-blocking material and a high-permittivity material film 77, the light shielding section 76 embedded in the high-permittivity material film 77. For example, the light shielding section 76 is made of a material such as tungsten (W), aluminum (Al), and copper (Cu) and is connected to a GND (not shown). The high-permittivity material film 77 is made of a material such as silicon dioxide ($SiO_2$), hafnium oxide ($HfO_2$), tantalum pentoxide ($Ta_2O_5$), and zirconium dioxide ($ZrO_2$).

Moreover, the light shielding section 76 is formed of a lid section 76a disposed in such a way as to cover the semiconductor substrate 63 and an embedded section 76b embedded in a vertical groove (a trench section 84 of FIG. 12) formed in the semiconductor substrate 63 in such a way as to surround the PD 51 and the charge retaining section 54. That is, the lid section 76a is formed in almost parallel with the layers forming the pixel 41, and the embedded section 76b is formed to a predetermined depth in such a way as to extend in a direction almost perpendicular to the lid section 76a.

Here, the embedded section 76b of the light shielding section 76 is formed in the inter-pixel separation region 75 in such a way as to surround the PD 51 and the charge retaining section 54. In addition to this configuration, the embedded section 76b of the light shielding section 76 may form the periphery of the charge retaining section 54 or may be formed between the PD 51 and the charge retaining section 54. That is, the embedded section 76b simply has to be formed at least between the PD 51 and the charge retaining section 54 in such a way that the PD 51 and the charge retaining section 54 are separated by the embedded section 76b.

Figure 7:
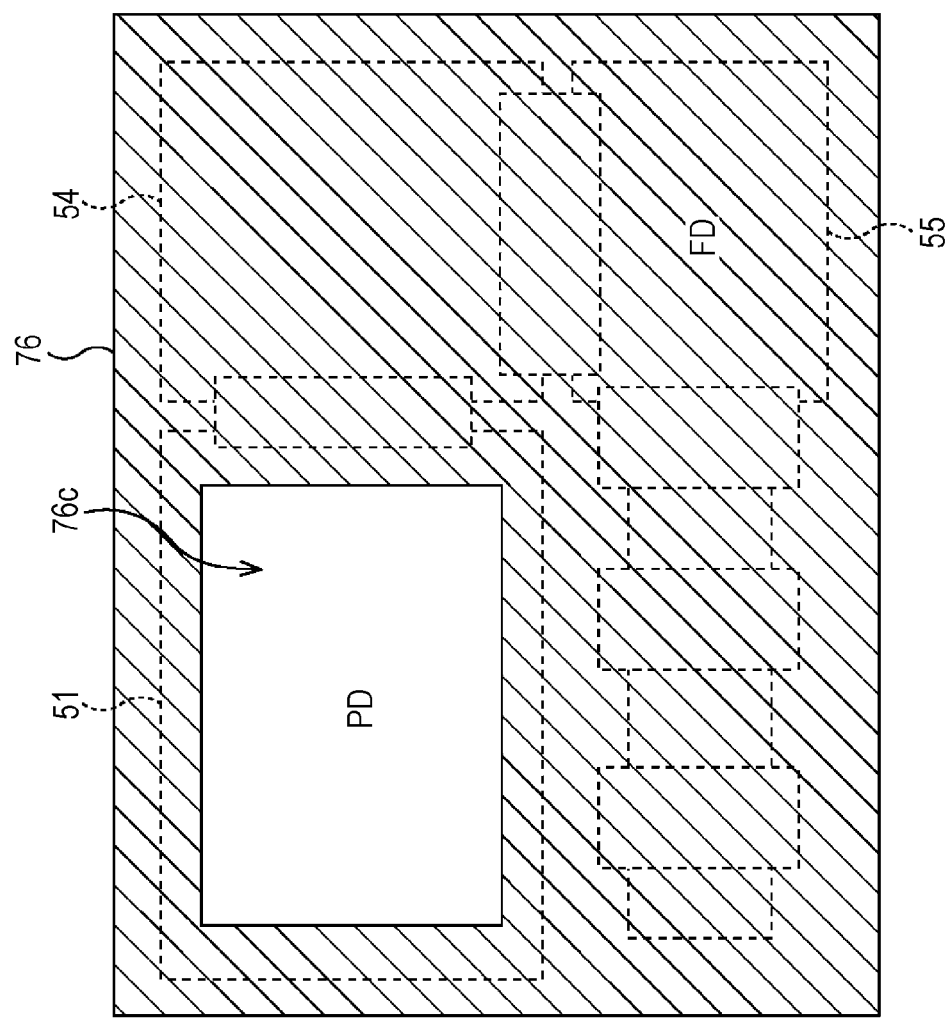
FIG. 7 is a diagram showing a planar configuration example of a light shielding section.

Moreover, in the light shielding section 76, an opening 76c for making the light enter the PD 51 is formed. That is, as in a planar configuration example of the light shielding section 76 shown in FIG. 7, the opening 76c is formed in a region corresponding to the PD 51, and other regions such as regions in which the charge retaining section 54 and the FD 55 are formed are shielded from the light by the light shielding section 76.

In the color filter layer 65, filters that allow the lights of corresponding colors to pass therethrough are disposed for each pixel 41. For example, filters that allow green, blue, and red lights to pass therethrough are disposed for each pixel 41 in a so-called Bayer pattern.

The on-chip lens 66 is a small lens for concentrating the incident light entering the pixel 41 onto the PD 51.

As described above, the pixel 41 includes the light shielding section 76 having the embedded section 76b at least between the PD 51 and the charge retaining section 54. As a result, as indicated with solid-white arrows in FIG. 6, even when the light is incident obliquely and passes through the PD 51, the light can be blocked by the embedded section 76b. This makes it possible to prevent the light from leaking into the charge retaining region 68. Therefore, it is possible to prevent the generation of optical noise which may be generated when the light leaks into the charge retaining region 68.

Moreover, by forming the embedded section 76b in such a way as to surround the charge retaining section 54, it is possible to prevent the generation of optical noise even when the size of the charge retaining section 54 is increased and ensure the full well capacity of the charge retaining section 54 adequately. That is, in an existing configuration, to prevent the generation of optical noise, it is necessary to form a small charge retaining section. However, forming a small charge retaining section decreases the full well capacity. On the other hand, in the pixel 41, by blocking the light by the embedded section 76b, it is possible to increase the volume of the charge retaining section 54 and, for example, form the charge retaining section 54 from an area near the front side of the semiconductor substrate 63 to an area near the back side of the semiconductor substrate 63. This makes it possible to ensure a sufficient full well capacity.

Furthermore, in the pixel 41, since a back-illuminated-type structure is adopted, it is possible to increase the sensitivity of the PD 51. This makes it possible to prevent a reduction in sensitivity caused as a result of the area of the PD 51 having become small.

Therefore, in the solid-state image sensor 31 having the pixel 41, it is possible to keep the sensitivity necessary for the PD 51 and prevent the generation of optical noise in the charge retaining section 54. This allows the charge retaining section 54 to secure a sufficient full well capacity. Thus, the solid-state image sensor 31 can obtain a better pixel signal than that of an existing solid-state image sensor and obtain a low-noise pixel signal with a wide dynamic range even at a low intensity of illumination, for example.

Next, with reference to FIGS. 8 to 15, a method for producing the solid-state image sensor 31 having the pixel 41 will be described.

Figure 8:
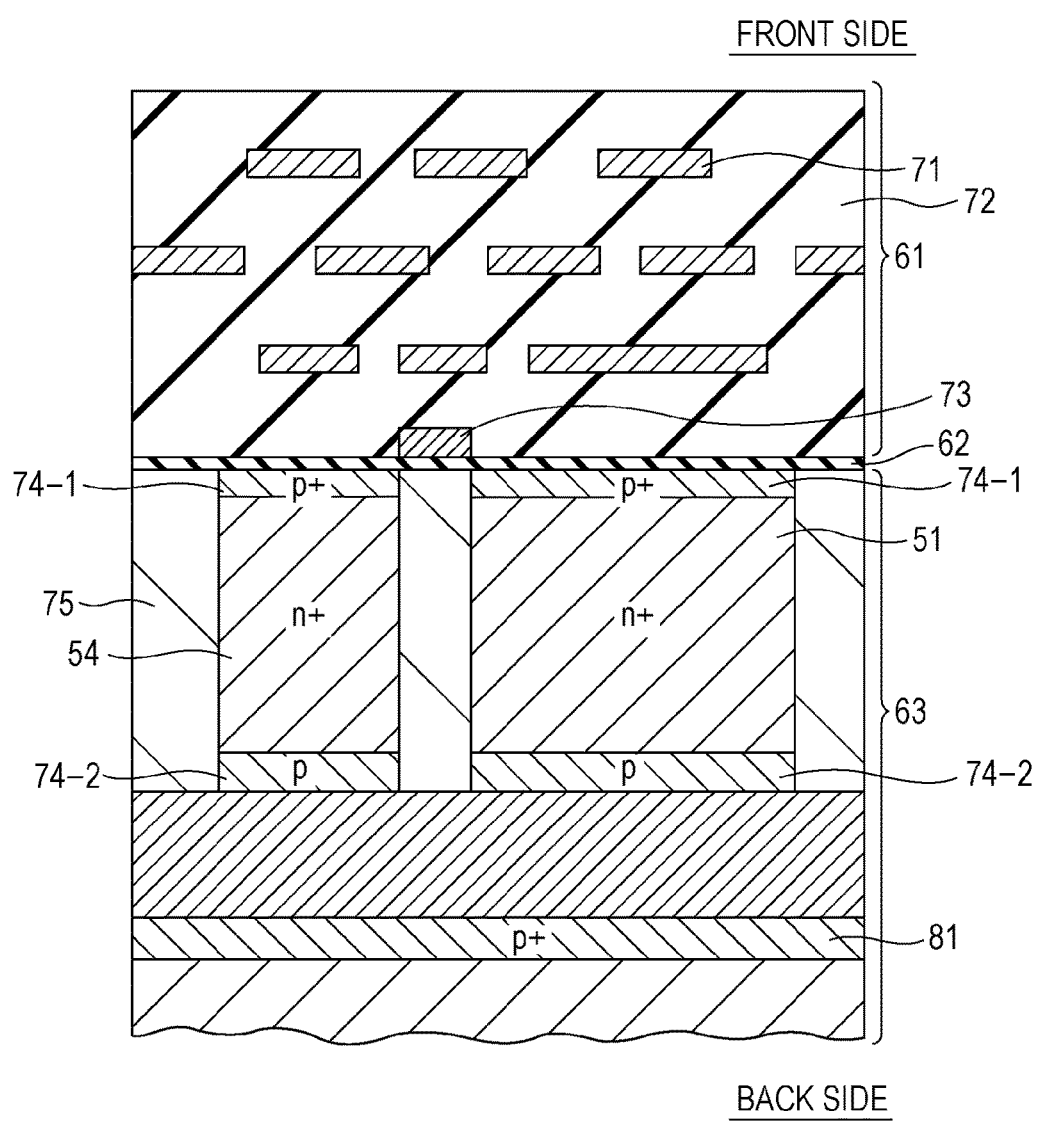
FIG. 8 is a diagram illustrating a first process.

In a first process, as shown in FIG. 8, as in a method for producing a common solid-state image sensor, high-concentration impurities are ion-implanted into the semiconductor substrate 63 having an etching stopper layer 81 to form the front pinning layer 74-2, the PD 51, the charge retaining section 54, and the front pinning layer 74-1. Then, after the oxide film 62 is stacked on the front side of the semiconductor substrate 63 and the gate electrode 73 is formed, the wiring 71 is formed every time the interlayer dielectric film 72 is stacked in a predetermined thickness. In this way, the wiring layer 61 is formed.

Figure 9:
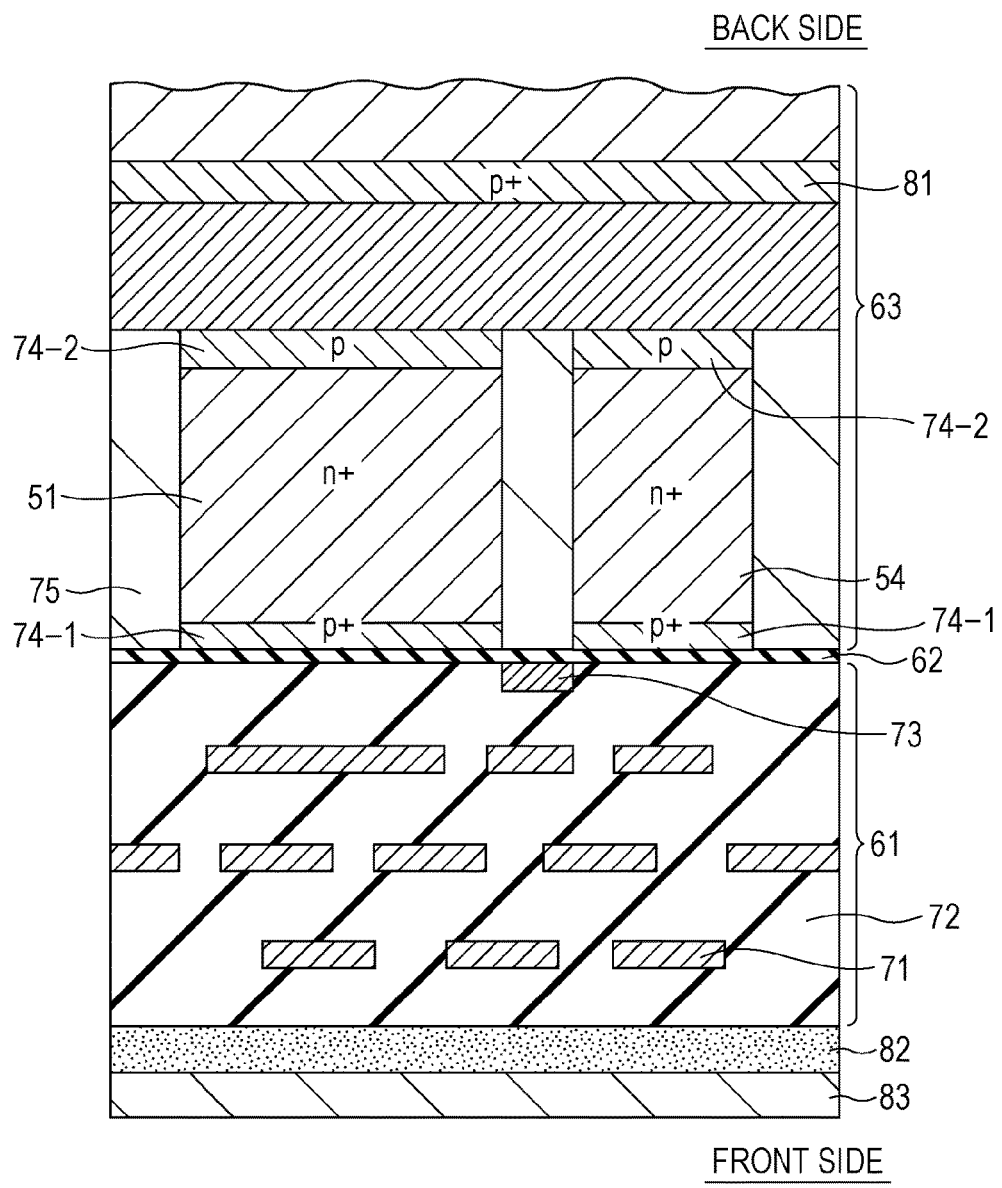
FIG. 9 is a diagram illustrating a second process.

In a second process, after an adhesive layer 82 is formed on the front side of the wiring layer 61 and a support substrate 83 is bonded to the adhesive layer 82, the entire structure is inverted as shown in FIG. 9, and a face on the back side of the semiconductor substrate 63 is polished by a physical polishing method.

Figure 10:
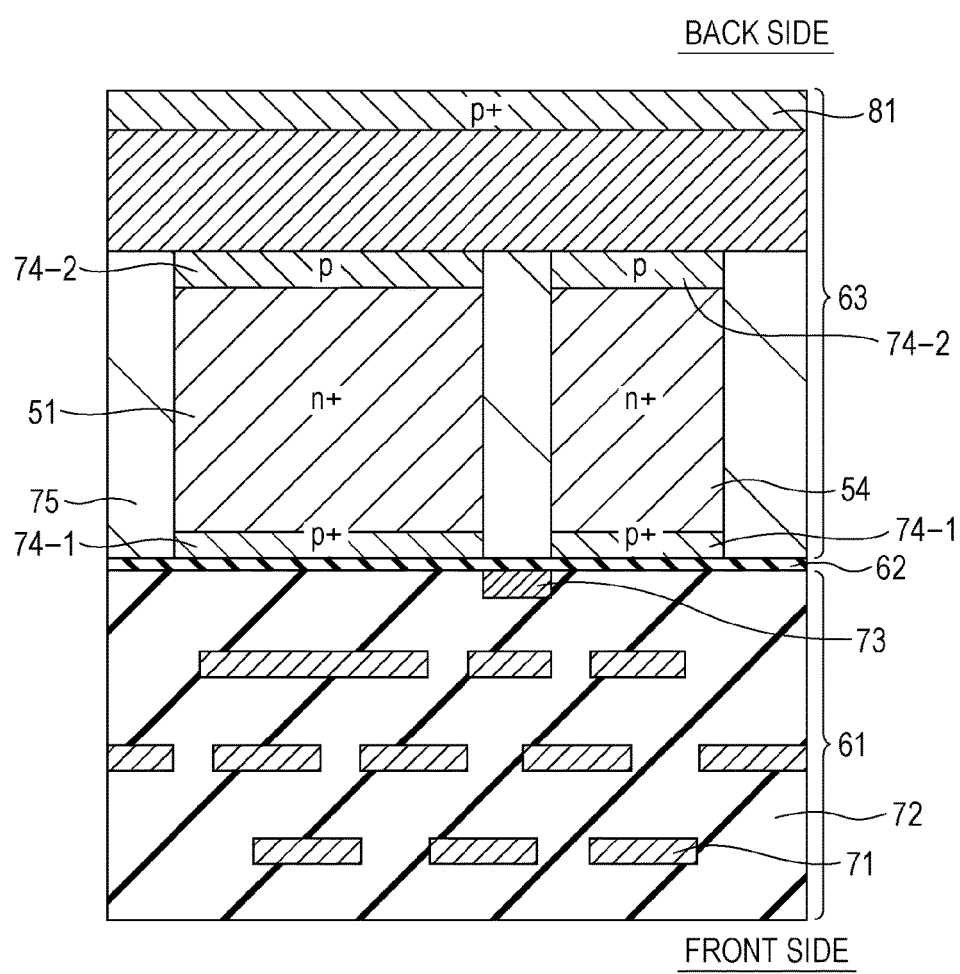
FIG. 10 is a diagram illustrating a third process.

In a third process, a layer located on the back side of the etching stopper layer 81 of the semiconductor substrate 63 is etched by wet etching. At this time, etching is stopped by the etching stopper layer 81 formed of high-concentration p-type impurities. In this way, the etching stopper layer 81 is exposed as shown in FIG. 10.

In a fourth process, after the etching stopper layer 81 is removed, the back side of the semiconductor substrate 63 is polished by CMP (chemical mechanical polishing) method. By doing so, the back side of the semiconductor substrate 63 is made thinner as shown in FIG. 11.

In a fifth process, after a resist is formed on the back side of the semiconductor substrate 63, exposure and development of the resist layer is performed in such a way that an opening is formed in a region in which the embedded section 76b of the light shielding section 76 shown in FIG. 6 is to be formed. Then, by performing dry etching using the resist layer as a mask, the trench section 84 shown in FIG. 12 is formed.

Figure 13:
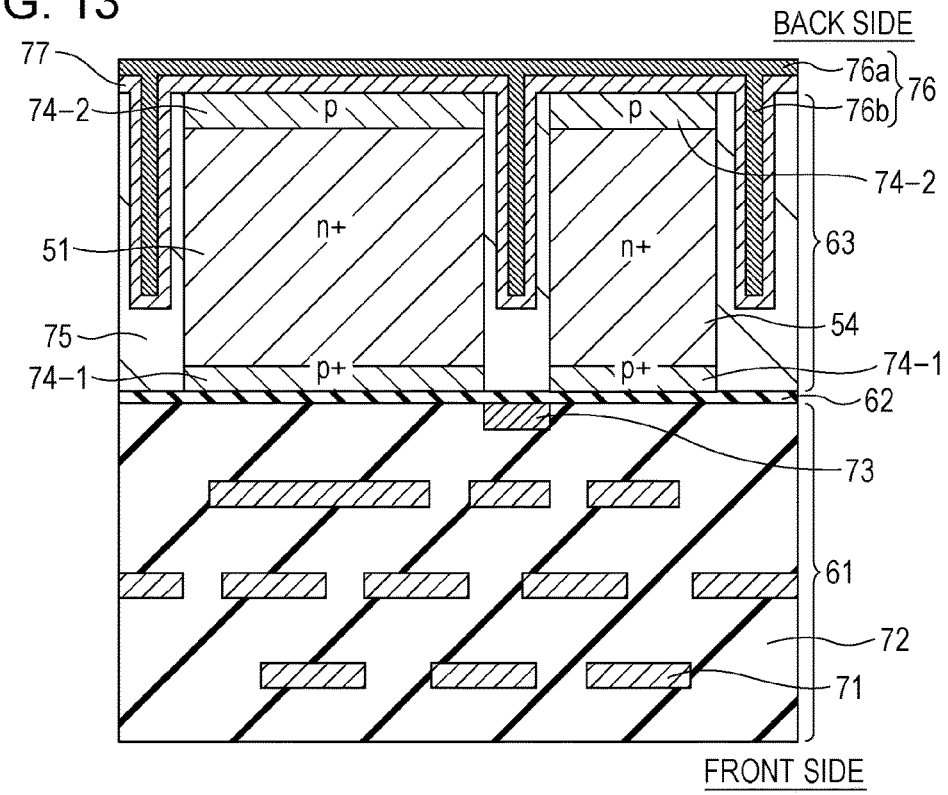
FIG. 13 is a diagram illustrating a sixth process.

In a sixth process, the high-permittivity material film 77 is formed on the side and bottom faces of the trench section 84 and the back side of the semiconductor substrate 63. Then, from the back side of the high-permittivity material film 77, the light shielding section 76 is formed on the face on the back side of the high-permittivity material film 77 and the inside of the trench section 84. As a result, as shown in FIG. 13, the light shielding section 76 having the lid section 76a formed on the back side of the high-permittivity material film 77 and the embedded section 76b formed inside the trench section 84 is formed. For example, the light shielding section 76 is formed by performing CVD (chemical vapor deposition) by using tungsten as a material.

Figure 14:
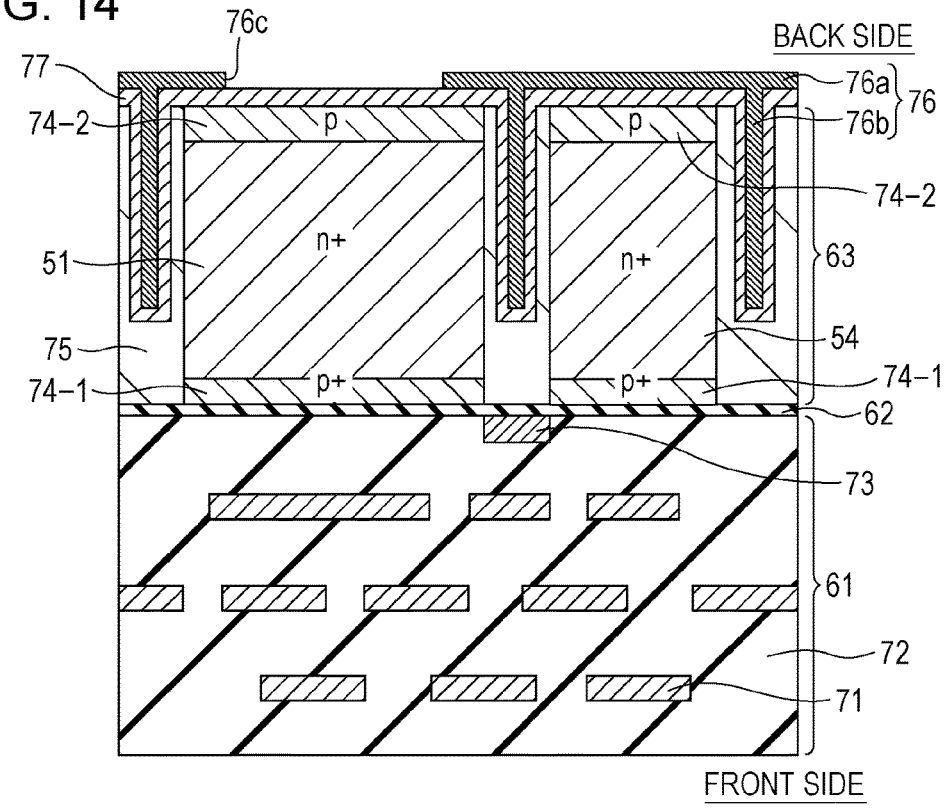
FIG. 14 is a diagram illustrating a seventh process.

In a seventh process, the light shielding section 76 is etched by dry etching. By doing so, the opening 76c is formed as shown in FIG. 14.

Figure 15:
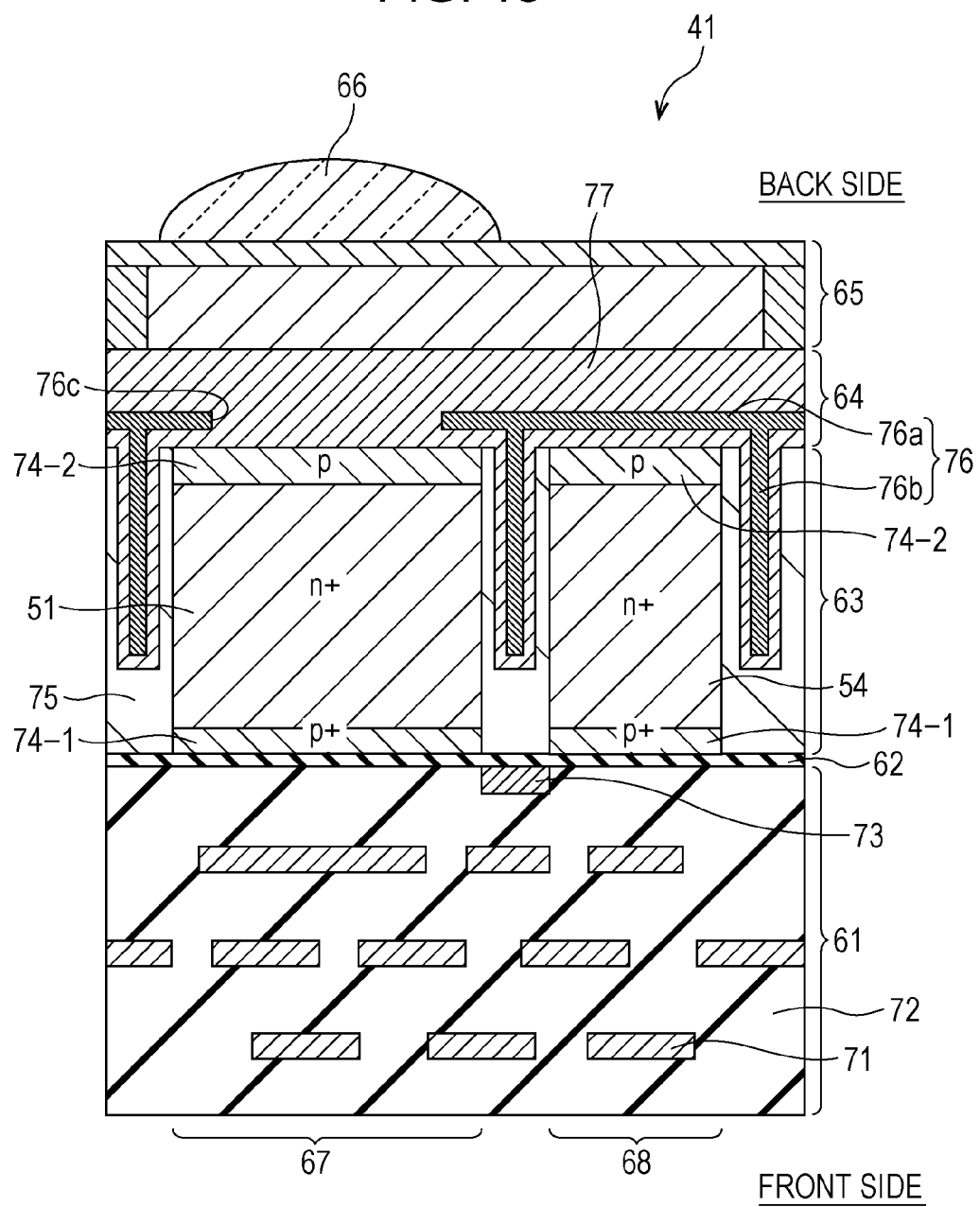
FIG. 15 is a diagram illustrating an eighth process.

In an eighth process, the high-permittivity material film 77 is stacked on the light shielding section 76 and planarized by using ALD (atomic layer deposition) method, for example. Then, as shown in FIG. 15, the color filter layer 65 and the on-chip lens 66 are formed by using the usual method.

By the processes described above, it is possible to produce the solid-state image sensor 31 having the pixel 41.

Next, with reference to FIG. 16, another embodiment of the pixel will be described.

Figure 16:
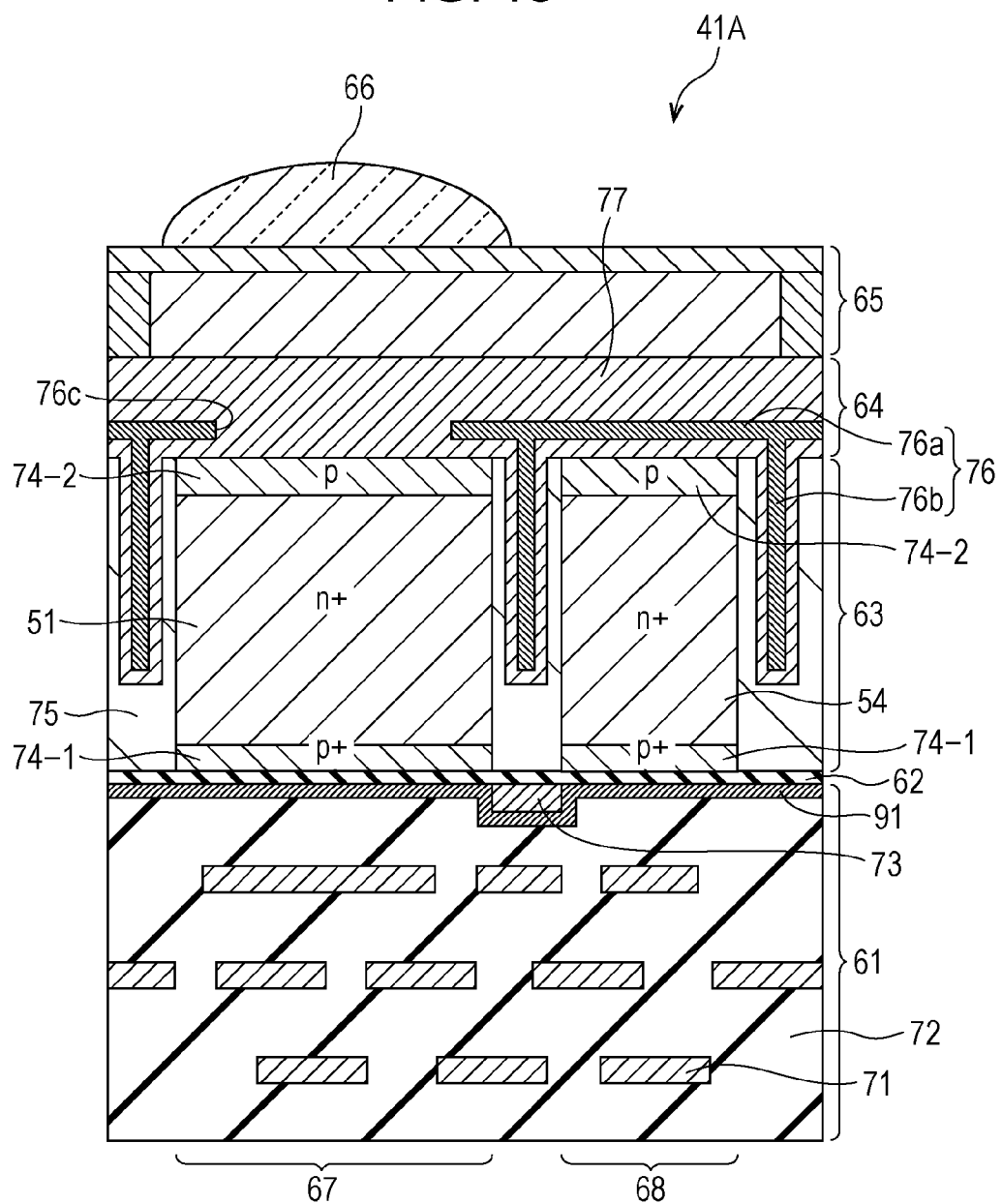
FIG. 16 is a sectional view showing a second configuration example of the pixel.

A pixel 41A shown in FIG. 16 differs from the pixel 41 of FIG. 6 in that a front-side light shielding section 91 is formed in such a way as to cover the front side (the side where the wiring layer 61 is located) of the PD region 67 and the charge retaining region 68. In other respects, the pixel 41A is the same as the pixel 41. It is to be noted that such components as are found also in the pixel 41 are identified with the same reference characters as appropriate, and their detailed descriptions will be omitted.

As is the case with the light shielding section 76, the front-side light shielding section 91 can block light and prevents the light illuminating the PD 51 from passing through the PD 51 and entering the wiring layer 61. For example, in a configuration in which no front-side light shielding section 91 is provided, when the light that has illuminated the PD 51 and entered the wiring layer 61 is reflected from the wiring 71 in the wiring layer 61 and enters the charge retaining section 54 retaining the charge, it is assumed that optical noise is generated by the light.

Therefore, by providing the front-side light shielding section 91, the light illuminating the PD 51 is prevented from passing through the PD 51 and entering the wiring layer 61. This makes it possible to prevent the generation of optical noise and obtain a better pixel signal.

Next, with reference to FIGS. 17 and 18, a modified example of the other embodiment of the pixel will be described.

Figure 17:
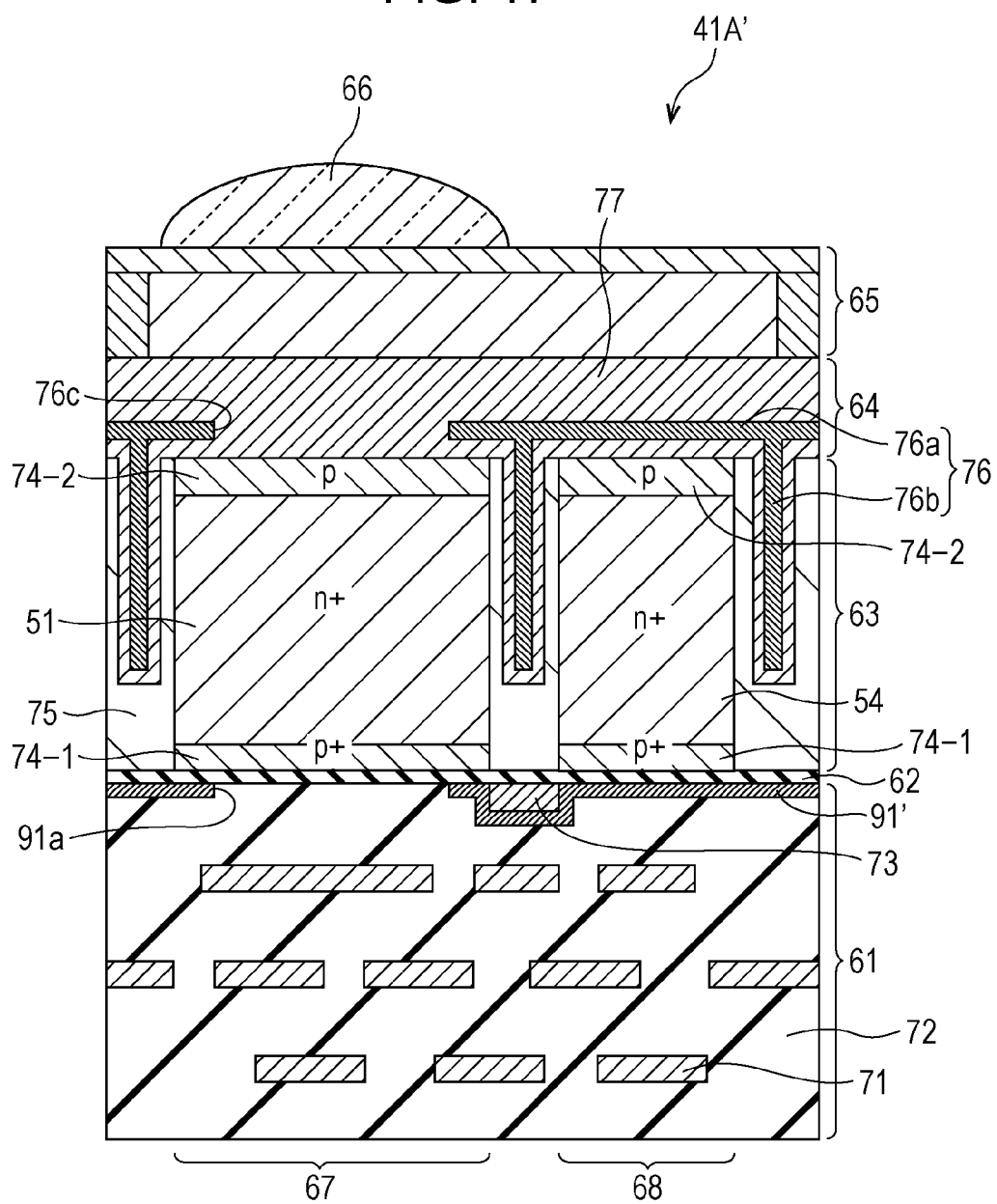
FIG. 17 is a sectional view showing a modified example of the second configuration example of the pixel.
Figure 18:
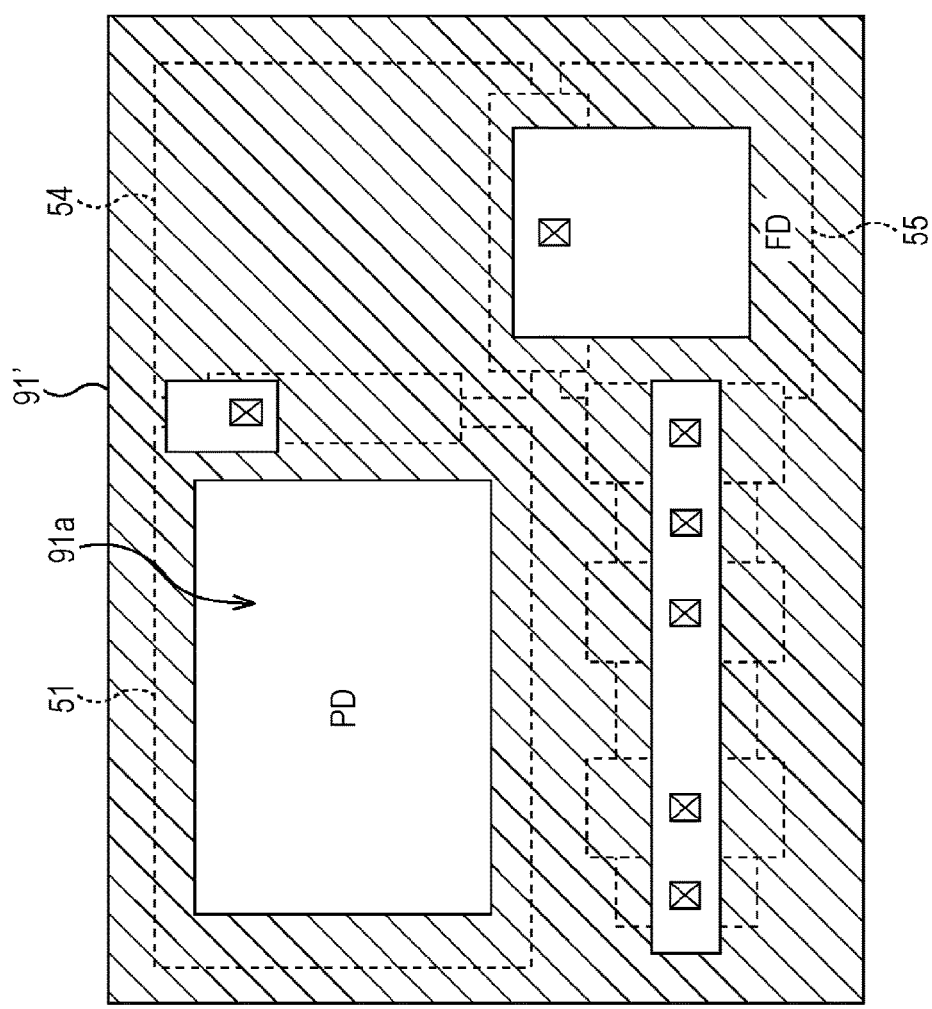
FIG. 18 is a diagram showing a planar configuration example of the light shielding section.

A pixel 41A' shown in FIG. 17 differs from the pixel 41A of FIG. 16 in that a front-side light shielding section 91' is formed in such a way as to cover the front side (the side where the wiring layer 61 is located) of the charge retaining region 68. In other respects, the pixel 41A' is the same as the pixel 41A. It is to be noted that such components as are found also in the pixel 41A are identified with the same reference characters as appropriate, and their detailed descriptions will be omitted.

The front-side light shielding section 91' has an opening 91a formed in a region corresponding to the PD 51, and, as is the case with the front-side light shielding section 91 of FIG. 16, the front-side light shielding section 91' is formed in such a way as to shield the front side of the charge retaining section 54 from light. Specifically, as shown in FIG. 18, although the front-side light shielding section 91' has the opening 91a formed in a region corresponding to the PD 51 and has an opening for allowing various through electrodes to pass, the front-side light shielding section 91' is formed in such a way as to cover the charge retaining section 54 completely.

By providing such a front-side light shielding section 91', it is possible to prevent the light reflected from the wiring 71 in the wiring layer 61 from entering the charge retaining section 54 even when the light illuminating the PD 51 passes through the PD 51 and enters the wiring layer 61. Therefore, it is possible to prevent the generation of optical noise and obtain a better pixel signal.

Next, with reference to FIG. 19, still another embodiment of the pixel will be described.

Figure 19:
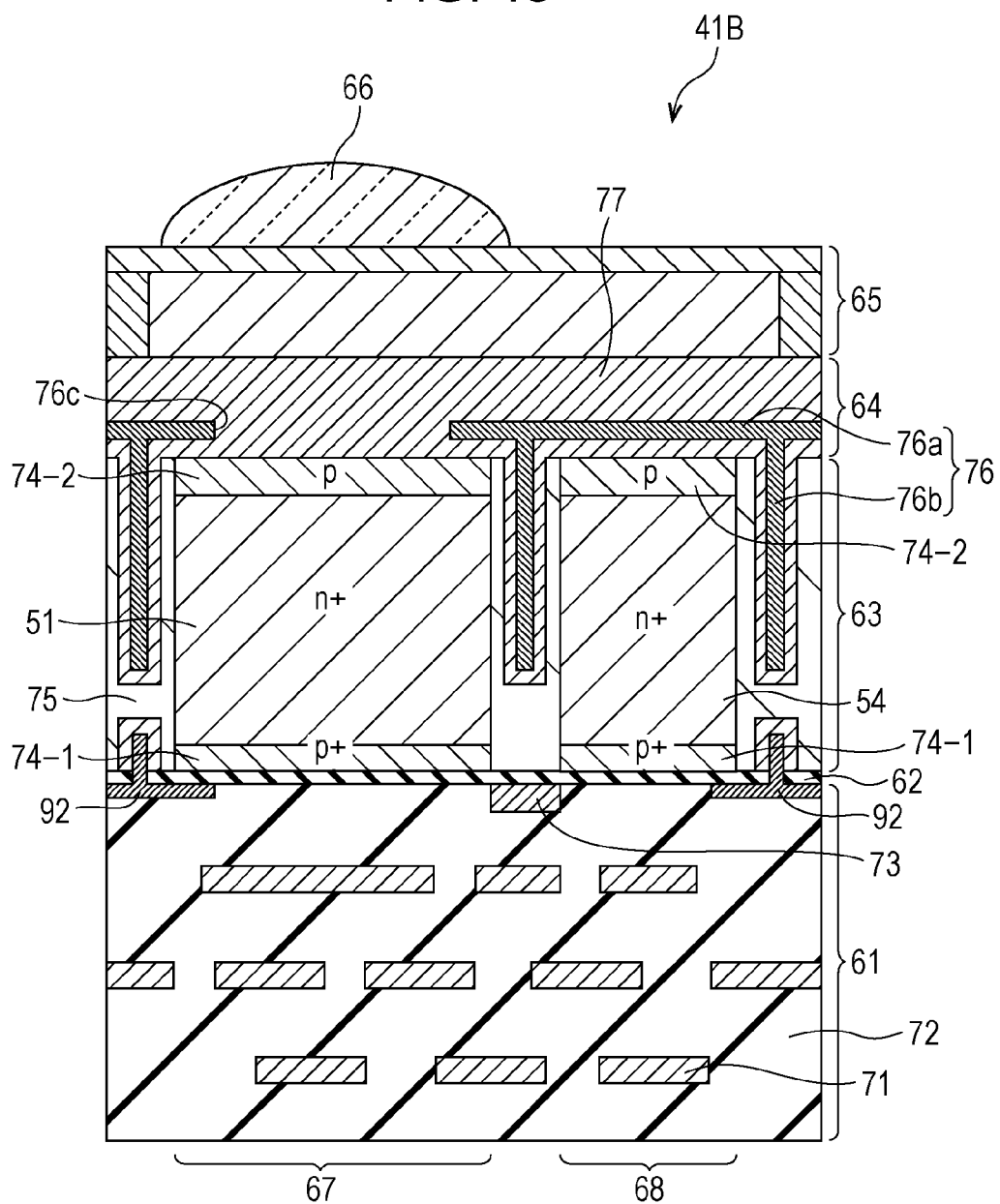
FIG. 19 is a sectional view showing a third configuration example of the pixel.

A pixel 41B shown in FIG. 19 differs from the pixel 41 of FIG. 6 in that a light shielding section 92 having an embedded section embedded in the semiconductor substrate 63 from the front side (the side where the wiring layer 61 is located) of the semiconductor substrate 63 is formed in such a way as to extend therefrom. In other respects, the pixel 41B is the same as the pixel 41. It is to be noted that such components as are found also in the pixel 41 are identified with the same reference characters as appropriate, and their detailed descriptions will be omitted.

The light shielding section 92 is provided in a portion other than a transfer region provided between the PD 51 and the charge retaining section 54. By providing the light shielding section 92, it is possible to prevent the leakage of light into the charge retaining section 54 more effectively and prevent the generation of optical noise.

Next, with reference to FIG. 20, yet another embodiment of the pixel will be described.

Figure 20:
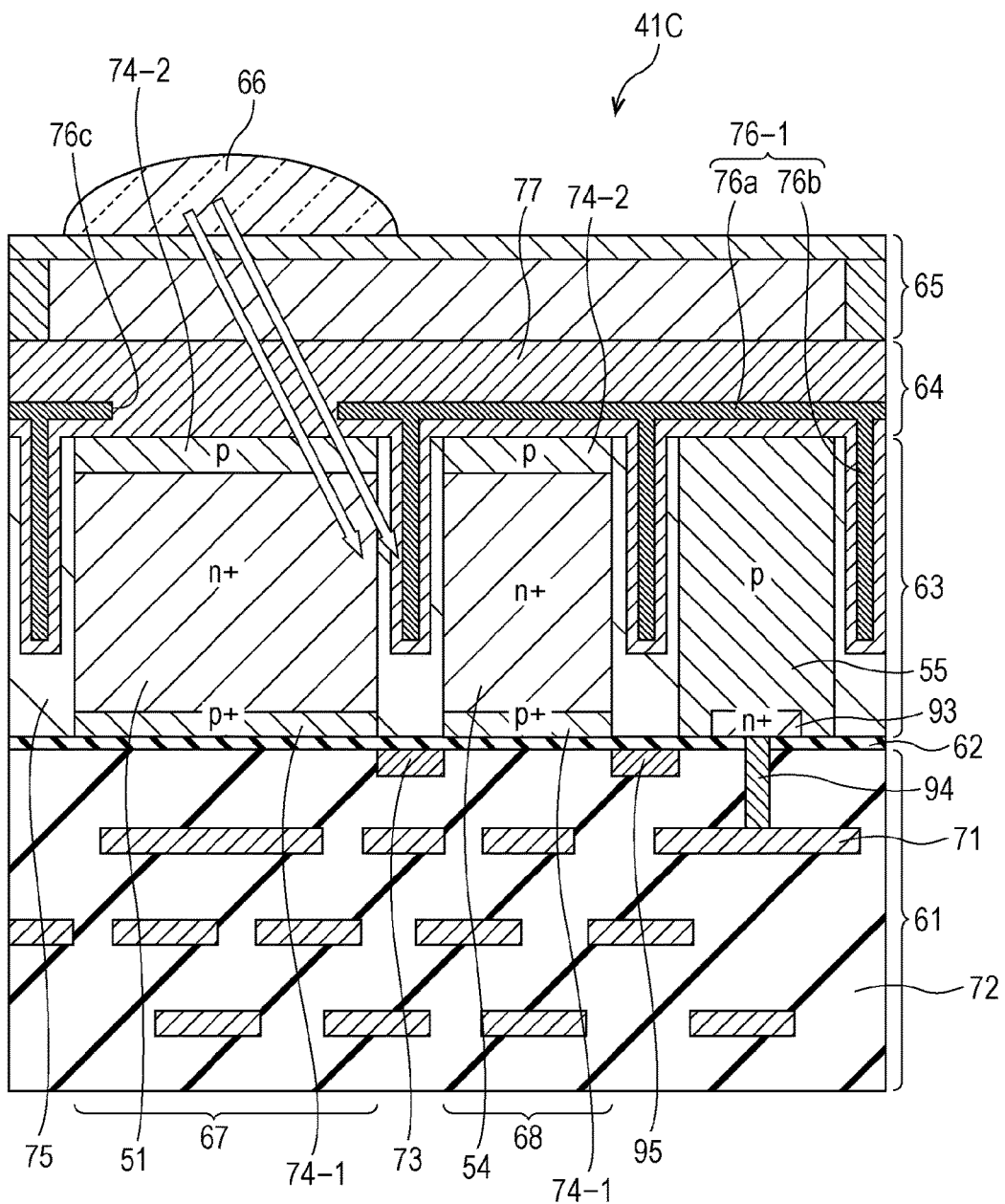
FIG. 20 is a sectional view showing a fourth configuration example of the pixel.

In FIG. 20, a sectional view of a pixel 41C including a portion in which the FD 55 is formed is shown. The pixel 41C differs from the pixel 41 of FIG. 6 in that the embedded section 76b is formed in such a way that a light shielding section 76-1 surrounds the FD 55. In other respects, the pixel 41C is the same as the pixel 41. It is to be noted that such components as are found also in the pixel 41 are identified with the same reference characters as appropriate, and their detailed descriptions will be omitted.

As shown in FIG. 20, in the pixel 41C, an n-type contact region 93 is formed on the front side of a p-type region forming the FD 55, and the contact region 93 is connected to the wiring 71 via a contact section 94. Moreover, in a region between the charge retaining section 54 and the FD 55, a gate electrode 95 forming the second transfer transistor 53 is disposed on the semiconductor substrate 63 with the oxide film 62 located between the gate electrode 95 and the semiconductor substrate 63.

The light shielding section 76-1 includes the lid section 76a disposed in such a way as to cover the semiconductor substrate 63 and the embedded section 76b embedded in a vertical groove formed in the semiconductor substrate 63 in such a way as to surround the PD 51, the charge retaining section 54, and the FD 55.

As described above, the light shielding section 76-1 can adopt a configuration in which the FD 55 is also surrounded with the embedded section 76b. This makes it possible to prevent the generation of optical noise more effectively.

Next, with reference to FIG. 21, yet another embodiment of the pixel will be described.

Figure 21:
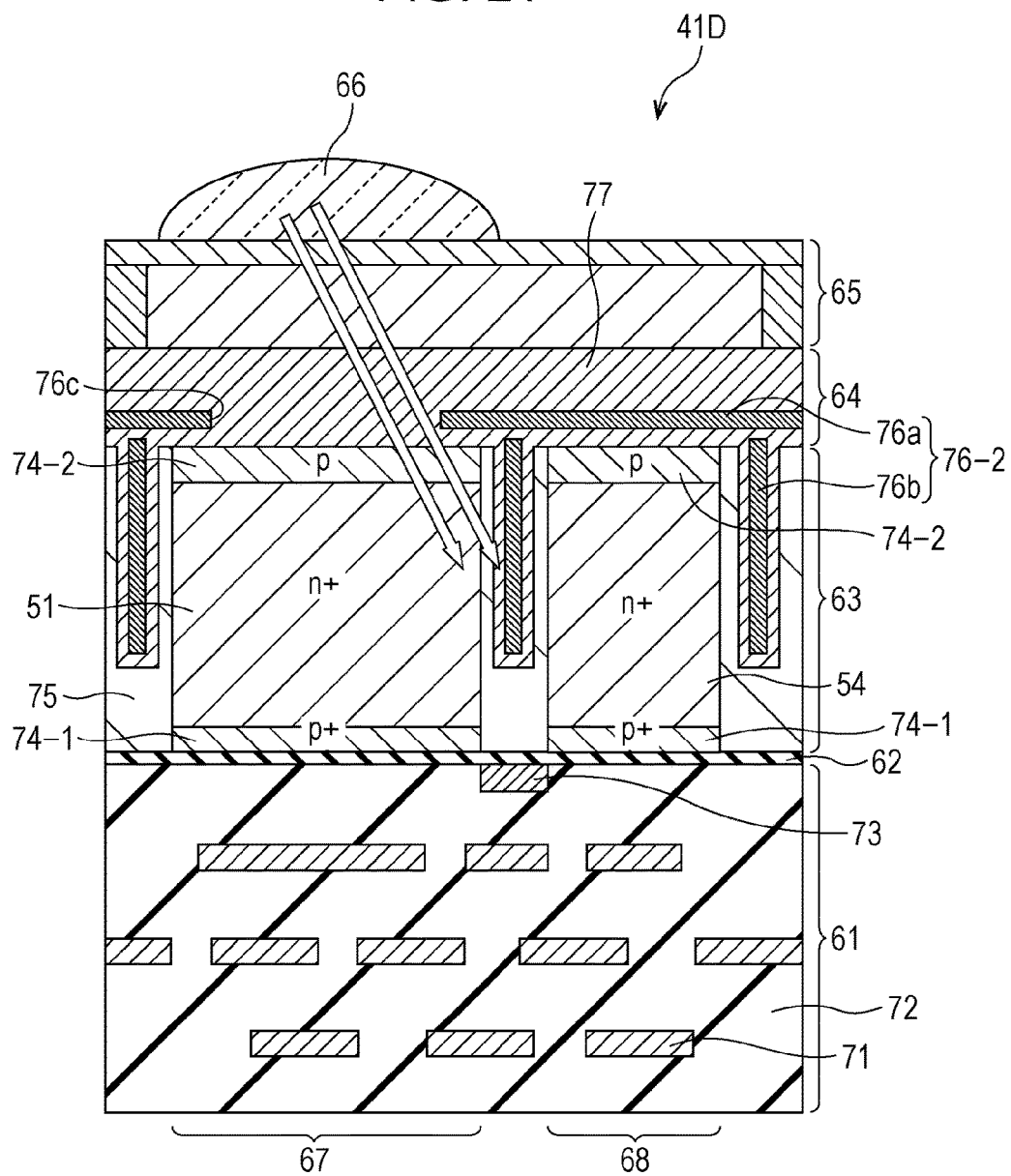
FIG. 21 is a sectional view showing a fifth configuration example of the pixel.

A pixel 41D shown in FIG. 21 differs from the pixel 41 of FIG. 6 in that a light shielding section 76-2 is formed of the lid section 76a and the embedded section 76b, which are separated from each other. In other respects, the pixel 41D is the same as the pixel 41. It is to be noted that such components as are found also in the pixel 41 are identified with the same reference characters as appropriate, and their detailed descriptions will be omitted.

That is, in the pixel 41 of FIG. 6, the light shielding section 76 is formed in such a way that the lid section 76a and the embedded section 76b are connected to each other. The lid section 76a and the embedded section 76b do not have to be connected to each other as described above. As long as the light incident in an oblique direction can be blocked by the embedded section 76b, the lid section 76a and the embedded section 76b may be separated from each other as in the pixel 41D and clearance may be provided between the lid section 76a and the embedded section 76b.

Next, with reference to FIG. 22, a modified example of the yet other embodiment of the pixel will be described.

Figure 22:
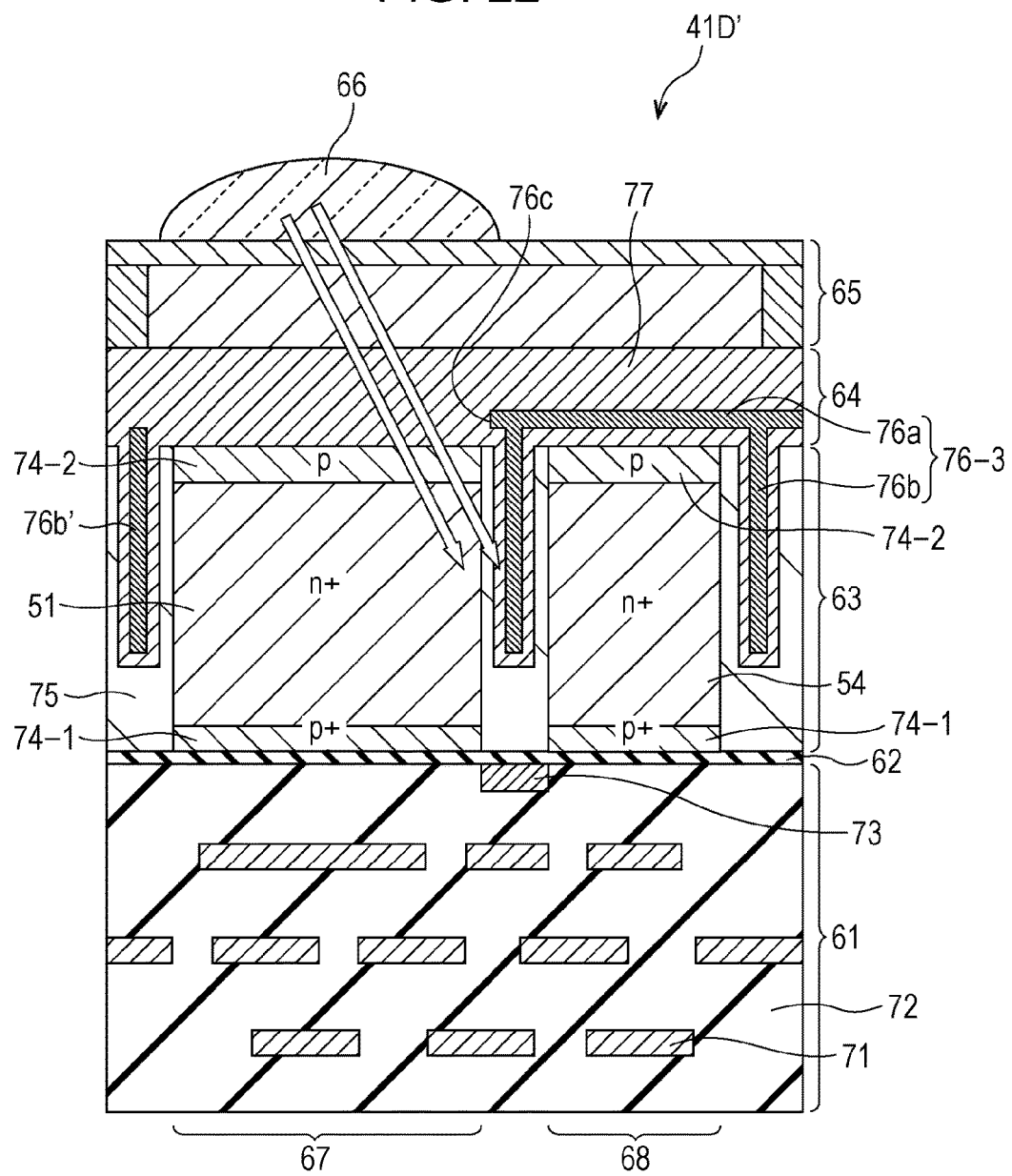
FIG. 22 is a sectional view showing a modified example of the fifth configuration example of the pixel.

In a pixel 41D' shown in FIG. 22, part of the lid section 76a and the embedded section 76b is separated and forms a light shielding section 76-3, and an embedded section 76b' disposed around the PD 51 is separated from the lid section 76a. In other respects, the pixel 41D' is the same as the pixel 41.

As described above, it is possible to adopt a configuration in which the lid section 76a and the embedded section 76b are separated (or part of the lid section 76a and the embedded section 76b is separated) to form the light shielding section 76-3. Also with this configuration, it is possible to prevent the leakage of light into the charge retaining section 54 and prevent the generation of optical noise.

Next, with reference to FIG. 23, yet another embodiment of the pixel will be described.

Figure 23:
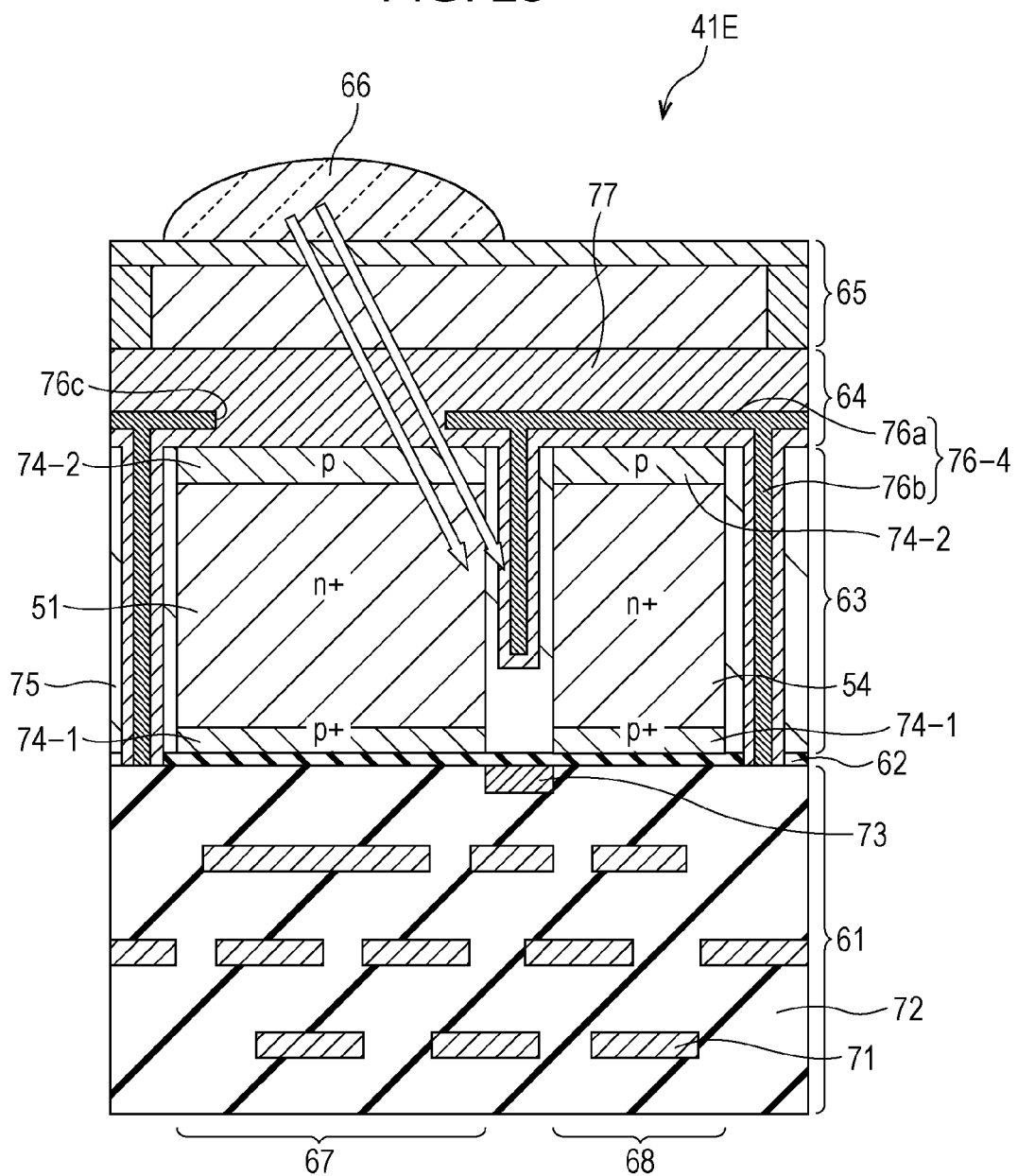
FIG. 23 is a sectional view showing a sixth configuration example of the pixel.

A pixel 41E shown in FIG. 23 differs from the pixel 41 of FIG. 6 in that a light shielding section 76-4 is formed in such a way that part of the embedded section 76b penetrates the semiconductor substrate 63. In other respects, the pixel 41E is the same as the pixel 41. It is to be noted that such components as are found also in the pixel 41 are identified with the same reference characters as appropriate, and their detailed descriptions will be omitted.

The light shielding section 76-4 is formed in such a way that the embedded section 76b in a region other than a region between the PD 51 and the charge retaining section 54, that is, other than a region which is a transfer path over which the charge is transferred from the PD 51 to the charge retaining section 54, penetrates the semiconductor substrate 63. In other words, although it is difficult to form the light shielding section in a region between the PD 51 and the charge retaining section 54 because the region is used for transfer of charges, forming the embedded section 76b in a region other than the region between the PD 51 and the charge retaining section 54 makes it possible to prevent effectively the leakage of light into the charge retaining section 54 from a region other than the PD 51 of the same pixel 41E. Incidentally, a method for forming the light shielding section in such a way as to penetrate the substrate is disclosed in detail in Japanese Unexamined Patent Application Publication No. 2010-226126, which the applicant of the present technology filed.

Next, with reference to FIG. 24, yet another embodiment of the pixel will be described.

Figure 24:
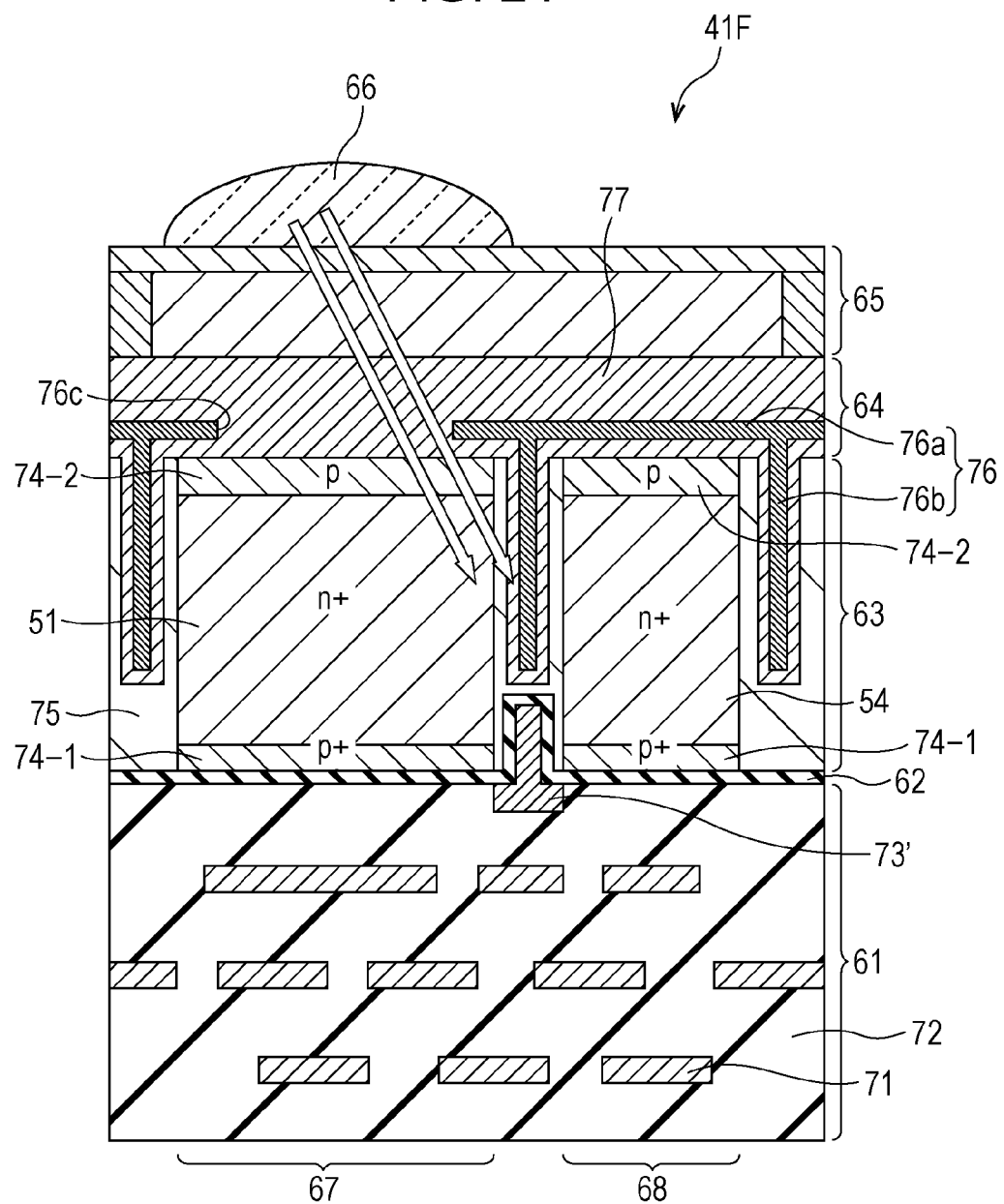
FIG. 24 is a sectional view showing a seventh configuration example of the pixel.

A pixel 41F shown in FIG. 24 differs from the pixel 41 of FIG. 6 in that a vertical electrode 73' is formed. In other respects, the pixel 41F is the same as the pixel 41. It is to be noted that such components as are found also in the pixel 41 are identified with the same reference characters as appropriate, and their detailed descriptions will be omitted.

As shown in FIG. 24, in place of the gate electrode 73 of the pixel 41 of FIG. 6, the pixel 41F includes, as an electrode forming the first transfer transistor 52, the vertical electrode 73' embedded from the wiring layer 61 toward the semiconductor substrate 63. Adopting such a vertical electrode 73' makes it easier to transfer the charge from the PD 51 to the charge retaining section 54 and makes it possible to transfer the charge more reliably.

Moreover, the vertical electrode 73' is formed after a trench is formed by digging a hole on the front side of the semiconductor substrate 63, a through film is formed, pinning is performed to remove the through film, and the oxide film 62 is formed.

Figure 1:
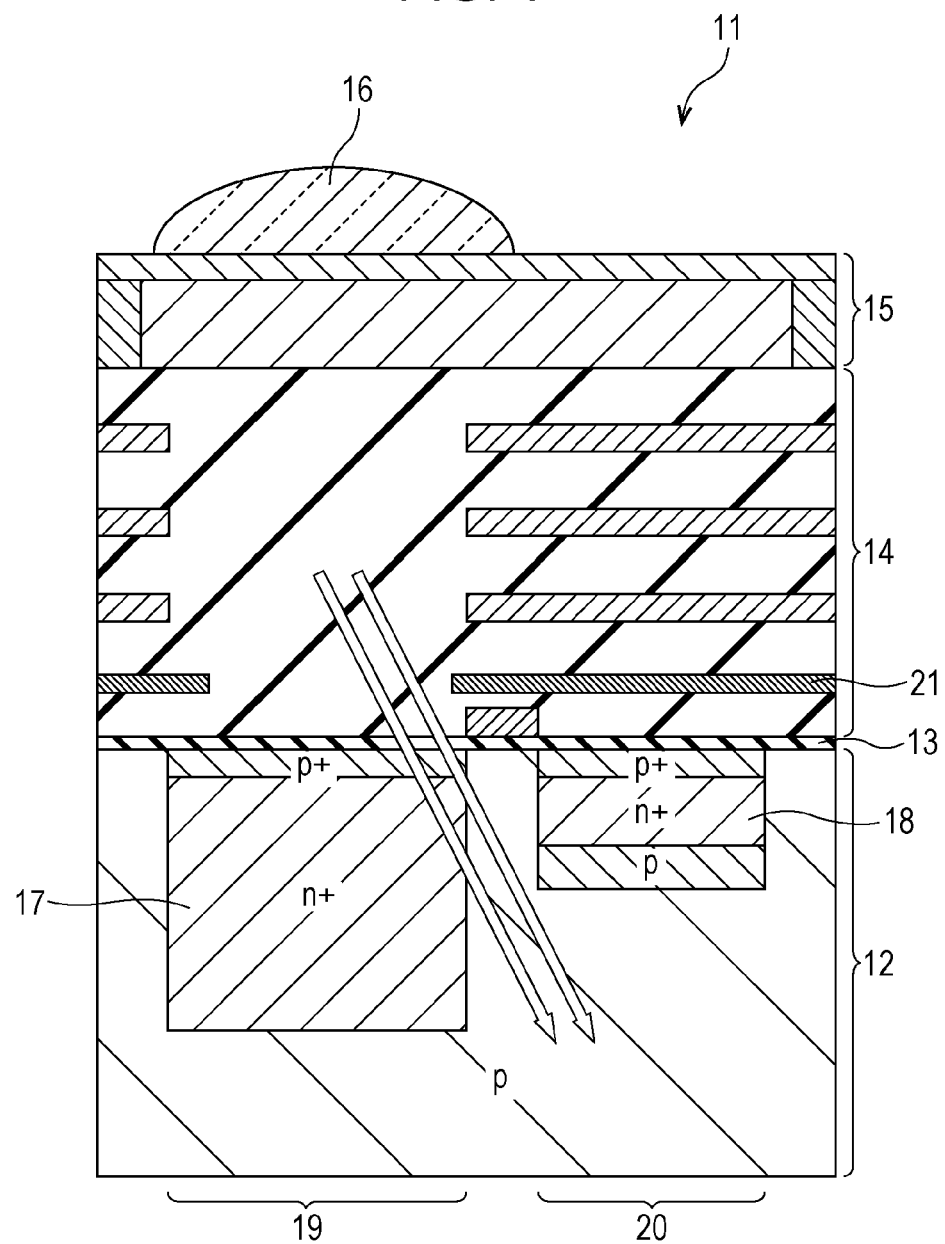
FIG. 1 is a diagram showing a sectional configuration example of an existing pixel.
Figure 2:
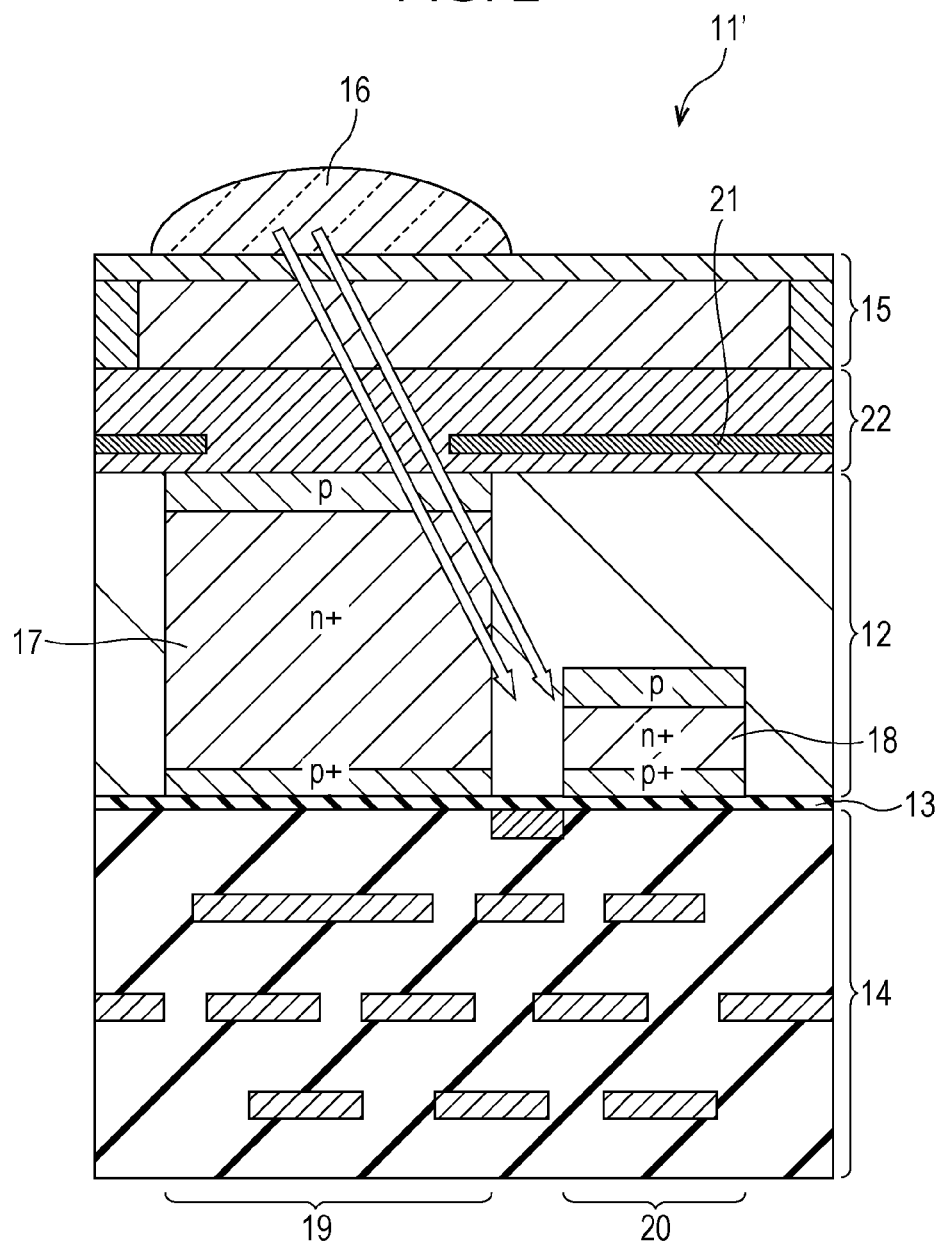
FIG. 2 is a diagram showing a sectional configuration example of an existing pixel in a back-illuminated-type CMOS image sensor.

Moreover, in addition to the back-illuminated-type CMOS solid-state image sensor, the solid-state image sensor 31 according to the embodiment of the present technology can be applied to a front-illuminated-type CMOS solid-state image sensor. In this case, for example, in the CMOS image sensor with the configuration shown in FIG. 1, an embedded section of a light shielding film, the embedded section which extends in a nearly vertical direction in such a way as to connect to the light shielding film 21 and is embedded in the semiconductor substrate 12, is formed between the PD 17 and the charge retaining section 18.

Incidentally, in the solid-state image sensor 31, to implement the global shutter, the charge retaining section 54 is provided and the charges are transferred from the PDs 51 to the charge retaining sections 54 concurrently. However, for example, a configuration in which no charge retaining section 54 is provided and the charges are transferred from the PDs 51 to the FDs 55 concurrently may be adopted. In this case, the embedded section 76b is formed in such a way as to surround the FD 55.

Moreover, the solid-state image sensor 31 configured as described above can be applied to, for example, various kinds of electronic apparatus such as an imaging system such as a digital still camera and a digital video camera, a cellular telephone with an imaging function, or other apparatus with an imaging function.

Figure 25:
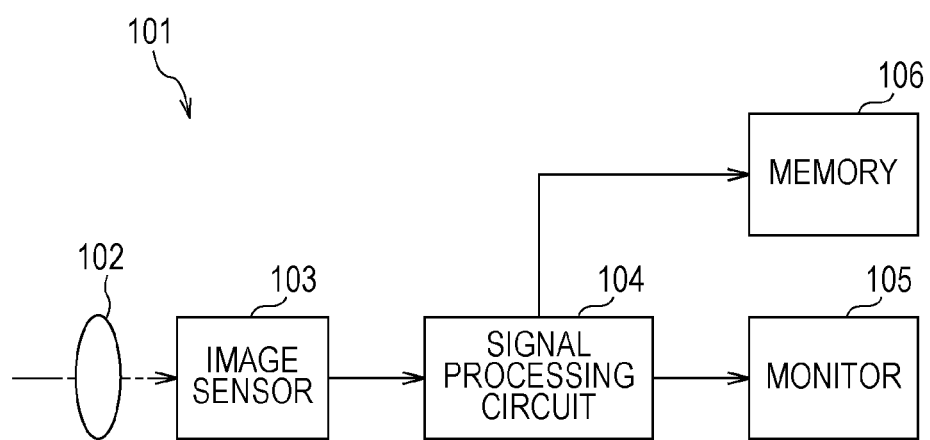
FIG. 25 is a block diagram showing a configuration example of an imaging device which is installed in an electronic apparatus.

FIG. 25 is a block diagram showing a configuration example of an imaging device installed in an electronic apparatus.

As shown in FIG. 25, an imaging device 101 includes an optical system 102, an image sensor 103, a signal processing circuit 104, a monitor 105, and a memory 106 and can take a still image and moving images.

The optical system 102 is formed of one lens or a plurality of lenses. The optical system 102 guides the image light (the incident light) from a subject to the image sensor 103 and forms an image on a light-receiving surface (a sensor section) of the image sensor 103.

As the image sensor 103, the solid-state image sensor 31 of each of the configuration examples and modified examples described above is used. In the image sensor 103, electrons are accumulated for a certain period of time in accordance with the image which is formed on the light-receiving surface via the optical system 102. Then, a signal based on the electrons accumulated in the image sensor 103 is supplied to the signal processing circuit 104.

The signal processing circuit 104 performs various kinds of signal processing on the signal charge output from the image sensor 103. The image (the image data) obtained as a result of the signal processing having been performed by the signal processing circuit 104 is supplied to the monitor 105 and displayed thereon or supplied to the memory 106 and stored therein (recorded thereon).

In the imaging device 101 configured as described above, by using, as the image sensor 103, the solid-state image sensor 31 of each of the configuration examples and modified examples described above, it is possible to obtain a better pixel signal and enhance image quality as compared to the image quality obtained by an existing imaging device.

Incidentally, the embodiment of the present technology can also adopt the following configuration.

(1) A solid-state image sensor including:
a semiconductor substrate having a photoelectric conversion element converting incident light into a charge and a charge retaining section temporarily retaining the charge photoelectrically converted by the photoelectric conversion element; and
a light shielding section having an embedded section extending in at least a region between the photoelectric conversion element and the charge retaining section of the semiconductor substrate.

(2) The solid-state image sensor according to (1) above, further including:
a wiring layer having a plurality of wirings; wherein
the light enters the photoelectric conversion element from a back side of the semiconductor substrate, the back side opposite to a front side of the semiconductor substrate on which the wiring layer is provided.

(3) The solid-state image sensor according to (1) or (2) above, wherein
the embedded section of the light shielding section is formed in such a way as to surround the photoelectric conversion element and the charge retaining section.

(4) The solid-state image sensor according to any one of (1) to (3) above, wherein
the light shielding section further has a lid section disposed in such a way as to cover at least the charge retaining section on the back side of the semiconductor substrate, the back side on which the light enters the photoelectric conversion element.

(5) The solid-state image sensor according to (4) above, wherein in the lid section of the light shielding section, an opening is formed in a region corresponding to the photoelectric conversion element.

(6) The solid-state image sensor according to any one of (1) to (3) above, wherein the light shielding section further has a front-side lid section disposed in such a way as to cover at least the charge retaining section on a front side of the semiconductor substrate opposite to a side on which the light enters the photoelectric conversion element.

(7) The solid-state image sensor according to (6) above, wherein in the front-side lid section of the light shielding section, an opening is formed in a region corresponding to the photoelectric conversion element.

It is to be understood that an embodiment is not limited to the embodiments described above and various changes can be made therein without departing from the spirit of the present technology.

What is claimed is:

1. An image sensor comprising:
   a semiconductor substrate including a first photoelectric conversion region adjacent to a second photoelectric conversion region;
   a plurality of on-chip lenses located above the semiconductor substrate;
   a light-shielding section including:
      an embedded section extending vertically in at least a region between the first photoelectric conversion region and the second photoelectric conversion region; and
      a lid section extending horizontally above the first photoelectric conversion region and a portion of the second photoelectric conversion region, wherein a portion of the lid section is between a first on-chip lens that corresponds to the second photoelectric conversion region and the portion of the second photoelectric conversion region; and a metallic oxide film disposed adjacent to the semiconductor substrate.

2. The image sensor according to claim 1, further comprising:
   a wiring layer having a plurality of wirings, wherein light is incident at a back side of the semiconductor substrate, the back side opposite to a front side of the semiconductor substrate on which the wiring layer is provided.

3. The image sensor according to claim 1, wherein the embedded section of the light-shielding section is formed in such a way as to surround the first photoelectric conversion region and a charge retaining section.

4. The image sensor according to claim 1, wherein in the lid section of the light-shielding section, an opening is formed in a region corresponding to the first photoelectric conversion region.

5. The image sensor according to claim 1, wherein the light-shielding section further includes a front-side lid section disposed in such a way as to cover at least a charge retaining section on a front side of the semiconductor substrate opposite to a side on which light enters the first photoelectric conversion region.

6. The image sensor according to claim 1, wherein the metallic oxide film is a material selected from the group consisting of silicon dioxide (SiO2), hafnium oxide (HfO2), tantalum pentoxide (Ta2O5), zirconium dioxide (ZrO2), and combinations thereof.

7. An image sensor comprising:
   a semiconductor substrate including a first photoelectric conversion region adjacent to a second photoelectric conversion region;
   a plurality of on-chip lenses located above the semiconductor substrate; and
   a light-shielding section including:
      an embedded section extending vertically in at least a region between the first photoelectric conversion region and the second photoelectric conversion region; and
      a lid section extending horizontally above the first photoelectric conversion region and a portion of the second photoelectric conversion region, wherein a portion of the lid section is between a first on-chip lens that corresponds to the second photoelectric conversion region and the portion of the second photoelectric conversion region, wherein the light-shielding section further includes a front-side lid section disposed in such a way as to cover at least a charge retaining section on a front side of the semiconductor substrate opposite to a side on which light enters the first photoelectric conversion region, and wherein, in the front-side lid section of the light-shielding section, an opening is formed in a region corresponding to the first photoelectric conversion region.

8. An image sensor comprising:
   a semiconductor substrate including a first photoelectric conversion region adjacent to a second photoelectric conversion region;
   a plurality of on-chip lenses located above the semiconductor substrate; and
   a light-shielding section including:
      an embedded section extending vertically in at least a region between the first photoelectric conversion region and the second photoelectric conversion region; and
      a lid section extending horizontally above the first photoelectric conversion region and a portion of the second photoelectric conversion region, wherein a portion of the lid section is between a first on-chip lens that corresponds to the second photoelectric conversion region and the portion of the second photoelectric conversion region, wherein the embedded section is directly connected to the lid section.

9. The image sensor according to claim 8, further comprising:
   a groove portion disposed in the semiconductor substrate, wherein at least a portion of the embedded section is disposed in the groove portion.

10. An electronic device comprising:
    an image sensor including:
       a semiconductor substrate including a first photoelectric conversion region adjacent to a second photoelectric conversion region;
       a plurality of on-chip lenses located above the semiconductor substrate; and a light-shielding section including:
an embedded section extending vertically in at least a region between the first photoelectric conversion region and the second photoelectric conversion region; and
a lid section extending horizontally above the first photoelectric conversion region and a portion of the second photoelectric conversion region, wherein a portion of the lid section is between a first on-chip lens that corresponds to the second photoelectric conversion region and the portion of the second photoelectric conversion region;
a lens configured to guide light to a light-incident surface of the image sensor; and
a metallic oxide film disposed adjacent to the semiconductor substrate, wherein the metallic oxide film is a material selected from the group consisting of silicon dioxide (SiO2), hafnium oxide (HfO2), tantalum pentoxide (Ta2O5), zirconium dioxide (ZrO2), and combinations thereof.

11. The electronic device according to claim 10, further comprising:
a wiring layer having a plurality of wirings, wherein light is incident at a back side of the semiconductor substrate, the back side opposite to a front side of the semiconductor substrate on which the wiring layer is provided.

12. The electronic device according to claim 10, wherein the embedded section of the light-shielding section is formed in such a way as to surround the first photoelectric conversion region and a charge retaining section.

13. The electronic device according to claim 10, wherein in the lid section of the light-shielding section, an opening is formed in a region corresponding to the first photoelectric conversion region.

14. The electronic device according to claim 10, wherein the light-shielding section further includes a front-side lid section disposed in such a way as to cover at least a charge retaining section on a front side of the semiconductor substrate opposite to a side on which light enters the first photoelectric conversion region.

15. An electronic device comprising:
an image sensor including:
a semiconductor substrate including a first photoelectric conversion region adjacent to a second photoelectric conversion region;
a plurality of on-chip lenses located above the semiconductor substrate; and
a light-shielding section including:
an embedded section extending vertically in at least a region between the first photoelectric conversion region and the second photoelectric conversion region; and
a lid section extending horizontally above the first photoelectric conversion region and a portion of the second photoelectric conversion region, wherein a portion of the lid section is between a first on-chip lens that corresponds to the second photoelectric conversion region and the portion of the second photoelectric conversion region; and
a lens configured to guide light to a light-incident surface of the image sensor, wherein the light-shielding section further includes a front-side lid section disposed in such a way as to cover at least a charge retaining section on a front side of the semiconductor substrate opposite to a side on which light enters the first photoelectric conversion region, and wherein, in the front-side lid section of the light shielding section, an opening is formed in a region corresponding to the first photoelectric conversion region.

16. An electronic device comprising:
an image sensor including:
a semiconductor substrate including a first photoelectric conversion region adjacent to a second photoelectric conversion region;
a plurality of on-chip lenses located above the semiconductor substrate; and
a light-shielding section including:
an embedded section extending vertically in at least a region between the first photoelectric conversion region and the second photoelectric conversion region; and
a lid section extending horizontally above the first photoelectric conversion region and a portion of the second photoelectric conversion region, wherein a portion of the lid section is between a first on-chip lens that corresponds to the second photoelectric conversion region and the portion of the second photoelectric conversion region; and
a lens configured to guide light to a light-incident surface of the image sensor, wherein the embedded section is directly connected to the lid section.

17. The electronic device according to claim 16, further comprising:
a groove portion disposed in the semiconductor substrate, wherein at least a portion of the embedded section is disposed in the groove portion.

* * * * *